US006973615B1

(12) United States Patent
Arad et al.

(10) Patent No.: US 6,973,615 B1
(45) Date of Patent: Dec. 6, 2005

(54) SYSTEM OF AND METHOD FOR DECODING TRELLIS CODES

(75) Inventors: Eran Arad, Misgav (IL); Efraim Dalumi, Misgav (IL); Shachar Kons, Haifa (IL); Donald B. Eidson, San Diego, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 493 days.

(21) Appl. No.: 10/013,490

(22) Filed: Dec. 13, 2001

Related U.S. Application Data

(60) Provisional application No. 60/386,197, filed on Nov. 13, 2001, provisional application No. 60/327,257, filed on Oct. 4, 2001, provisional application No. 60/255,874, filed on Dec. 15, 2000.

(51) Int. Cl.$^7$ ............................................. H03M 13/03

(52) U.S. Cl. ..................................................... 714/792

(58) Field of Search ............................... 714/786, 755, 714/791–796; 375/341, 262

(56) References Cited

U.S. PATENT DOCUMENTS

| | | | | |
|---|---|---|---|---|
| 5,181,209 | A | | 1/1993 | Hagenauer et al. ......... 714/795 |
| 5,537,444 | A | | 7/1996 | Nill et al. ..................... 375/341 |
| 5,541,955 | A | | 7/1996 | Jacobsmeyer ............... 375/222 |
| 5,844,946 | A | * | 12/1998 | Nagayasu .................... 375/341 |
| 5,933,462 | A | | 8/1999 | Viterbi et al. ................ 375/341 |
| 6,023,783 | A | | 2/2000 | Divsalar et al. ............. 714/792 |
| 6,219,388 | B1 | * | 4/2001 | Tanada et al. ............... 375/341 |
| 6,563,877 | B1 | * | 5/2003 | Abbaszadeh ................ 375/242 |
| 6,597,743 | B1 | * | 7/2003 | Khayrallah et al. ......... 375/265 |

OTHER PUBLICATIONS

Pietrobon, S.S., *Implementation and Performance of a Turbo/Map Decoder,* International Journal of Satellite Communications, vol. 16, pp. 23-46 (1998).

Robertson, P. and Worz, T., *Extensions of Turbo Trellis Coded Modulation to High Bandwidth Efficiencies,* Institute for Communication Technology, pp. 1251-1255 (1997).

Cherubini, G. and Olcer, S., *Concatenated Coding for Binary Partial-Response Channels,* Zurich Research Laboratory, IBM Research Division, pp. 1789-1794 (1994).

Bahl, L. R., et al., *Optimal Decoding of Linear Codes for Minimizing Symbol Error Rate;* IEEE Transactions on Information Theory, Mar. 1974, pp. 284-287.

Benedetto, S. and Montorsi, G., *Serial concatenation of block and convolutional codes,* Electronics Letters, vol. 32, No. 10, May 1996, pp. 887-888.

Benedetto, S. and Montorsi, G., *Iterative decoding of serially concatenated convolutional codes;* Electronics Letters, vol. 32, No. 13, Jun. 1996, pp. 1186-1188.

Benedetto, S., et al., *A Soft-Input Soft-Output Maximum A Posteriori (MAP) Module to Decode Parallel and Serial Concatenated Codes;* TDA Progress Report 42-127, Nov. 1996, pp. 1-20.

(Continued)

*Primary Examiner*—Shelly Chase
(74) *Attorney, Agent, or Firm*—Howrey LLP

(57) ABSTRACT

Systems and related methods are described for (1) determining one or more state probabilities for one or more states in a trellis representation; (2) determining an estimate of or extrinsic output for a bit using a trellis representation; (3) performing a MAX* 2->1 operation; and (4) computing forward state probabilities in a forward mode of operation and computing backward state probabilities in a backward mode of operation. Combinations of the foregoing are also described.

79 Claims, 27 Drawing Sheets

OTHER PUBLICATIONS

Benedetto, S. et al., *Serial Concatenated Trellis Coded Modulation with Iterative Decoding: Design and Performance,* submitted to IEEE Comm. Theory Mini Conference 97 (Globecom 97), pp. 38-43.

Benedetto, S., and Divsalar, D., *Turbo Codes: Analysis, Design, Iterative Decoding and Applications,* Course 909, Part II, International Courses for Telecom and Semiconductor Professionals, Oct. 25-29, 1999, Barcelona, Spain, pp. 324-339.

Berrou, C., et al., *Near Shannon Limit Error—Correcting Coding and Decoding: Turbo-Codes (1);* IEEE, 1993, pp. 1064-1070.

Divsalar, D. and Pollara, F., *Serial and Hydrid Concatenated Codes with Applications;* Jet Propulsion Laboratory, California Institute of Technology, pp. 1-8.

Divsalar, D. and Pollara, F., *Turbo Trellis Coded Modulation with Iterative Decoding for Mobile Satellite Communications;* Jet Propulsion Laboratory, California Institute of Technology, pp. 1-7.

Divsalar, D., et al., *Serial Turbo Trellis Coded Modulation with Rate-1 Inner Code,* Jet Propulsion Laboratory, California Institute of Technology, Jun. 2000, p. 194.

Divsalar, D., et al., *Serial Concatenated Trellis Coded Modulation with Rate-1 Inner Code,* IEEE, 2000, pp. 777-782.

Hagenauer, J. and Hoeher, P., *A Viterbi Algorithm with Soft-Decision Outputs and its Applications;* Proceedings of IEEE Globecom '89; Dallas, Texas, Nov. 1989; pp. 47.1.1-47.1.7.

Hoeher, Peter and Lodge, John, *"Turbo DPSK": Iterative Differential PSK Demodulation and Channel Decoding;* IEEE Transactions on Communications, vol. 47, No. 6, Jun. 1999, pp. 837-843.

Narayanan, K. R. and Stüber, G. L., *A Serial Concatenation Approach to Iterative Demodulation and Decoding;* IEEE Transactions on Communications, vol. 47, No. 7, Jul. 1999, pp. 956-961.

Nill, C. and Sundberg, C.W., *List and Soft Symbol Output Viterbi Algorithms: Extensions and Comparisons,* IEEE Transactions on Communications, vol. 43, Nos. 2/3/4, Feb./Mar./Apr., pp. 277-287.

Peleg, M. et al., *On Interleaved, Differentially Encoded Convolutional Codes,* IEEE Transactions on Information Theory, vol. 45, No. 7, Nov. 1999, pp. 2572-2582.

Robertson, P., et al., *A Comparison of Optimal and Sub-Optimal MAP Decoding Algorithms Operating in the Log Domain;* IEEE, 1995, pp. 1009-1013.

Viterbi, A., *An Intuitive Justification and a Simplified Implementation of the MAP Decoder for Convolutional Codes;* IEEE Journal on Selected Areas in Communications, vol. 16, No. 2, Feb. 1998, pp. 260-264.

\* cited by examiner

SYSTEM OF AND METHOD FOR DECODING TRELLIS CODES

This application claims the benefit of U.S. Provisional Application No. 60/386,197, filed Nov. 13, 2001, U.S. Provisional Application No. 60/327,257, filed Oct. 4, 2001, and U.S. Provisional Application No. 60/255,874, filed Dec. 15, 2000, each of which is hereby fully incorporated by reference herein as though set forth in full.

FIELD OF THE INVENTION

This invention generally relates to decoders, and, more specifically, to decoders of trellis codes.

RELATED ART

Trellis codes, such as convolutional codes, or parallel or series combinations or concatenations of convolutional codes, are codes which are decoded through use of a trellis. Trellis coded modulation (TCM) codes are groupings of trellis coded bits which result from mapping the bits into symbols, such as MPSK symbols, prior to transmission. The symbols may then be used to modulate a carrier, and the modulated carrier transmitted over a wireline or wireless interface. For additional information on trellis codes, such as serial or parallel concatenated convolutional codes, and TCM codes, such as serial concatenated trellis coded modulation codes (SCTCM) codes, please see U.S. Pat. No. 6,023,783; "Turbo Codes: Analysis, Design, Iterative Decoding and Applications," Course 909, Part II, International Courses for Telecom and Semiconductor Professionals, S. Benedetto & D. Divsalar, Oct. 25–29, 1999, Barcelona, Spain, pp. 324–339; "A Serial Concatenation Approach to Iterative Demodulation and Decoding," K. Narayanan et al., IEEE Transactions on Communications, Vol. 47, No. 7, July 1999; "'Turbo DPSK': Iterative Differential PSK Demodulation and Channel Decoding," P. Hoeher et al., IEEE Transactions on Communications, Vol. 47, No. 6, June 1999; "Serial and Hybrid Concatenated Codes with Applications," D. Divsalar et al., Proc. Int. Symp. Turbo Codes and Appls., Brest, France, September 1997, pp. 80–87; "Turbo Trellis Coded Modulation With Iterative Decoding for Mobile Satellite Communications," D. Divsalar et al., Proc. Int. Mobile Satellite Conf., June 1997; "Serial Concatenated Trellis Coded Modulation with Iterative Decoding: Design and Performance," submitted to IEEE Comm. Theory Mini Conference 97 (Globecom 97); "Near Shannon Limit Error-Correcting Coding: Turbo Codes," C. Berrou et al., Proc. 1993 IEEE International Conference on Communications, Geneva, Switzerland, pp. 1064–1070, May 1993; and "A Soft-Input Soft-Output Maximum A Posteriori (MAP) Module to Decode Parallel and Serial Concatenated Codes," S. Benedetto, TDA Progress Report 42–127, Nov. 12, 1996, each of which is hereby fully incorporated by reference herein as though set forth in full.

Decoders of trellis codes may be configured to determine soft or hard estimates of the underlying source bits or the encoded symbols, or for computing extrinsic outputs for the underlying source bits or encoded symbols, i.e., soft or hard estimates with a priori information about the bits or symbols removed. Various forms of decoders are possible including, for example, maximum a posteriori (MAP) decoders, log-MAP decoders, MAX-Log-MAP decoders, Viterbi decoders, Soft Output Viterbi (SOVA) decoders, A Posteriori Probability (APP) decoders, Soft List Viterbi (Soft-LVA) decoders, etc. For additional information on these decoders, please see "Optimal Decoding of Linear Codes for Minimizing Symbol Error Rate," L. R. Bahl et al., IEEE Transactions on Information Theory, March 1974, pp. 27–30; "Near Shannon Limit Error-Correcting Coding and Decoding: Turbo Codes," C. Berrou et al., Proc. ICC'93 Geneva, Switzerland, May 1993, pp. 1064–1070; "An Intuitive Justification and a Simplified Implementation of the MAP Decoder for Convolutional Codes," A. Viterbi, IEEE Journal On Selected Areas In Telecommunications, Vol. 16, No. 2, February 1998, pp. 260–264; S. Benedetto et al., "A Soft-Input Soft-Output Maximum A Posteriori (MAP) Module to Decode Parallel and Serial Concatenated Codes," TDA Progress Report 42–127, Nov. 15, 1996, pp. 1–20; D. Divsalar et al., "Turbo Trellis Coded Modulation with Iterative Decoding for Mobile Satellite Communications," Proc. Int. Mobile Satellite Conf., June 1997; "A Comparison of Optimal and Sub-Optimal MAP Decoding Algorithms Operating in the Log Domain," Proc. IC''95, Seattle, Wash. 1995, pp. 1009–1013; J. Hagenauer & P. Hoeher, "A Viterbi Algorithm With Soft-Decision Outputs and its applications," Proceedings of IEEE GLOBECOM, Dallas, Tex. sec. 47.1.1–47.1.7 (1989); U.S. Pat. No. 5,181,209; C. Nill & C. E. Sundberg, "List and Soft Symbol Output Viterbi Algorithms: Extensions and Comparisons," IEEE Transactions on Communications, vol. 43, nos. 2/3/4, pp. 277–87 (February March April 1995); and U.S. Pat. No. 5,537,444, each of which is hereby fully incorporated by reference herein as though set forth in full.

Known decoders of TCM codes are configured to handle QPSK symbols, but are susceptible to performance limitations in applications involving MPSK or QAM symbols beyond QPSK. The problem is particularly acute in applications involving log-MAP decoders, in which probabilities are expressed in the natural log domain. The computations needed to perform log-domain calculations places additional demands on the decoders.

RELATED APPLICATIONS

This application is related to co-pending U.S. patent application Ser. No. 10/013,492, filed on even date herewith, U.S. Provisional Application No. 60/386,182 Nov. 13, 2001 U.S. Provisional Application No. 60/327,258, filed Oct. 4, 2001, and U.S. Provisional Application No. 60/255,797, filed Dec. 15, 2000, each of which is owned in common by the assignee hereof, and each of which is hereby fully incorporated by reference herein as though set forth in full.

SUMMARY

The invention provides ba system for determining one or more state probabilities for one or more states in a trellis representation. In one embodiment of the system, branch metric logic determines branch metrics for one or more of the branches between one or more states in a first portion of the trellis and one or more states in a second portion of the trellis, and state probability logic determines state probabilities for one or more of the states. In one embodiment, the system concurrently normalizes the one or more state probabilities responsive to assertion of a normalization control signal. In one implementation, the state probability logic determines a state probability for a state by deriving branch values for one or more branches exiting or entering the state, and then derives the state probability by performing a group operation on the branch values. In one implementation example, the group operation is the MAX* operation.

In a second embodiment, the state probability logic comprises p state probability logic modules for determining in parallel state probabilities for each of p states, where p is an integer of two or more. In one embodiment, the system concurrently normalizes the one or more state probabilities responsive to assertion of a normalization control signal.

The invention also provides a system for determining an estimate of or extrinsic output for each of one or more bits. In one embodiment, the system iterates for each of the bits. In this embodiment, during a particular iteration, the system derives state values for each of one or more states in a trellis representation, where the state value for a state is derived from the forward state probability and the backward state probability for the state. Then, it derives a first value by performing a group operation on the state values for each of the states which imply release of a logical "1" for the bit, and second value by performing a group operation on the state values for each of the states which imply release of a logical "0" for the bit. It then derives an estimate of or extrinsic output for the bit from the first and second values. In one implementation, the group operation is the MAX* operator. In one implementation example, the system derives an estimate of the bit by subtracting the second value from the first and comparing the difference with a threshold of 0. If the difference equals or exceeds the threshold, the estimate is taken to be a logical "1". If the difference is less than the threshold, the estimate is taken to be a logical "0".

In a second embodiment, during a particular iteration, the system derives a branch values for each of one or more branches in the trellis representation, where the branch value for a branch is derived from the forward state probability of the originating state for the branch, the branch metric for the branch, the backward state probability for the terminating state of the branch, and, possibly, the a priori probability. The system derives a first value by performing a group operation on the branch values for each of the branches which imply release of a logical "1", and a second value by performing a group operation on the branch values for each of the branches which imply release of a logical "0". It then derives the estimate or extrinsic output for the bit from the first and second values. In one implementation, the group operator is the MAX* operator. In one implementation example, the system derives an extrinsic output for the bit from the difference between the first and second values.

The invention further provides a system for computing the MAX* of operands A and B. In one embodiment, first logic in the system tests the difference A−B relative to zero, and outputs a signal indicative thereof.

Second logic in the system determines the maximum of the operands A and B, MAX(A,B), by outputting a signal representative of the operand A if the signal from the first logic indicates that the difference A−B is greater than zero, and outputs a signal representative of the operand B otherwise.

Third logic in the system outputs a value corresponding to ln(1+exp(−|A−B|)). Fourth logic derives the output of the system from the sum of the outputs of the second and third logic while normalizing the output responsive to assertion of a normalization control signal.

The invention further provides a system for computing one or more state probabilities for the states in a trellis representation. This trellis representation has one or more branches between one or more states in a first portion of the trellis and one or more branches in a second portion of the trellis.

In one embodiment, branch metric logic in the system computes one or more branch metrics for one or more of the branches, and indication logic in the system indicates whether the system is configured to compute forward state probabilities or backward state probabilities.

State probability logic in the system (1) computes one or more forward state probabilities of one or more states in the second portion of the trellis, while normalizing the state probabilities responsive to assertion of a normalization control signal, provided the indication logic indicates the system is configured to compute forward state probabilities; and (2) computes one or more backward state probabilities of one or more states in the first portion of the trellis, while normalizing the state probabilities responsive to assertion of a control signal, provided the indication logic is configured to compute backward state probabilities.

In one implementation example, the system is part of a log-MAP decoder, and there are five states in the trellis at a time. In this implementation example, each branch is associated with one encoder input bit and two encoder output bits. Moreover, only two branches enter and exit each of the states at a time. A total of 64 branches correspond to a particular portion of the trellis.

In this implementation example, there are 32 instances of state probability logic, one for each of the 32 states in the trellis. Each instance may be configured to operate in a forward mode or a backward mode.

When the state probability logic for a particular state is configured to operate in the backward mode, the backward state probability for the state may be computed by first determining for each of the two branches exiting the state a branch value equal to the sum of the backward state probability of the terminating state of the branch and the branch metric for the branch. The backward state probability for the state is then derived from the MAX* of the branch values for each of the two branches exiting the state.

Similarly, when the state probability logic for a particular state is configured to operate in the forward mode, the forward state probability for the state may be computed by first determining for each of the two branches entering the state a branch value equal to the sum of the forward state probability of the originating state of the branch and the branch metric for the branch. The forward state probability for the state is then derived from the MAX* of the branch values for each the two branches entering the state.

Meanwhile, normalization control logic is configured to evaluate the most significant bits of the 64 branch values which are computed by the 32 renderings of the state probability logic at a time. If the most significant bits of any one of these 64 branch values equals or exceeds a constant, a normalization control signal is asserted. Responsive to the assertion of this normalization control signal, the 32 renderings of the state probability logic are configured to concurrently normalize the state probabilities.

In this implementation example, once the forward and backward state probabilities for a portion of the trellis have been computed, estimation logic is configured to determine an estimate of the encoder input bit associated with a particular portion of the trellis. In this implementation example, because of the code structure, all the branches entering the first 16 states of the trellis imply release of a logical "1" for the bit, and all the branches entering the next 16 states of the trellis imply release of a logical "0" for the bit. In this implementation, a state value is derived for each of the states equal to the sum of the forward and backward state probabilities for the state. A first value is then derived from the MAX* of the state values for the first 16 states of the trellis, and a second value is derived from the MAX* of the state values for the next 16 states of the trellis. The second value is then subtracted from the first value, and the resulting difference compared with a threshold of 0. If the difference equals or exceeds the threshold, the estimate is taken to be a logical "1". If the difference is less than the threshold, the estimate is taken to be a logical "0".

Also in this implementation example, once the forward and backward state probabilities for a particular portion of the trellis have been computed, extrinsic output logic is configured to determine an extrinsic output for each of the two encoder output bits associated with the particular portion of the trellis, one bit at time. In this implementation example, two iterations are performed, one for each of the two output bits. During a particular iteration, for each of the 64 branches that are present in the corresponding portion of the trellis, the system compute a branch value equal to the sum of the forward state probability of the originating state of the branch, the backward state probability of the terminating state of the branch, and the difference between the branch metric for the branch and the a priori probability for the bit.

A first value may then be derived from the MAX* of the branch values for each of the branches which imply release of a logical "1" for the bit in question, and a second value may be derived from the MAX* of the branch values for each of the branches which imply release of a logical "0" for the bit in question. The second value may be subtracted from the first to form an extrinsic output for the bit in question. This process may then repeated for the second encoder output bit.

Method counterparts to each of these systems are also provided. Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

Example Application

An example application of a system for decoding encoded bits according to the invention will first be described followed by a discussion of the system itself. This example application is included in order to provide context and aid in understanding the invention. However, many other applications of the invention are possible. Therefore, the inclusion of this application should not be construed as limiting.

Figure 1:
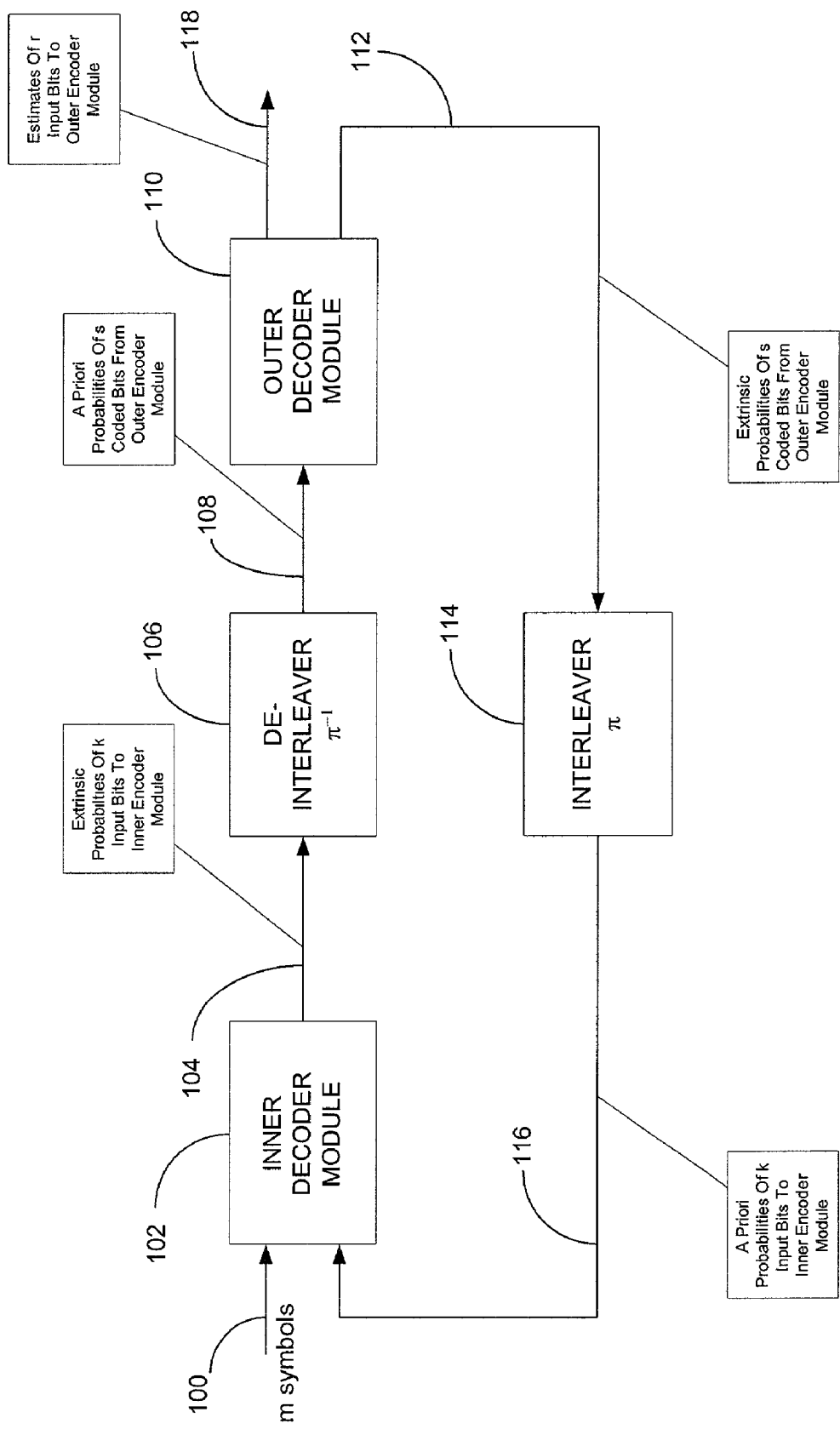
FIG. 1 is a block diagram of one example of a decoder of serial concatenated TCM codes.

The particular application which will be described is an application involving a decoder of serially concatenated trellis coded modulation (SCTCM) symbols as illustrated in FIG. 1, although it should be appreciated that other applications are possible, such as applications involving decoders of non-concatenated TCM codes, and decoders of parallel concatenated TCM codes.

As illustrated, m encoded symbols are input to inner decoder module 102 over one or more signal lines 100, where m is an integer of one or more. The symbols may be represented in quadrature form, i.e., in the form of two dimensional in-phase (I) and quadrature (Q) components, although other forms of representation are possible. The quadrature form of representation is convenient since the I and Q components of a symbol may be simultaneously represented as a single point or number on a complex I-Q plane. Therefore, in the ensuing discussion, this form of representation may be assumed unless otherwise noted.

These m symbols may have been produced by a suitable encoder, such as an SCTCM encoder, and then perturbed by noise through transmission over a wireless or wireline transmission channel. An embodiment of an SCTCM encoder is illustrated in FIG. 3, and this encoder will now be explained in order to provide additional context for understanding the operation of the decoder illustrated in FIG. 1.

Figure 3:
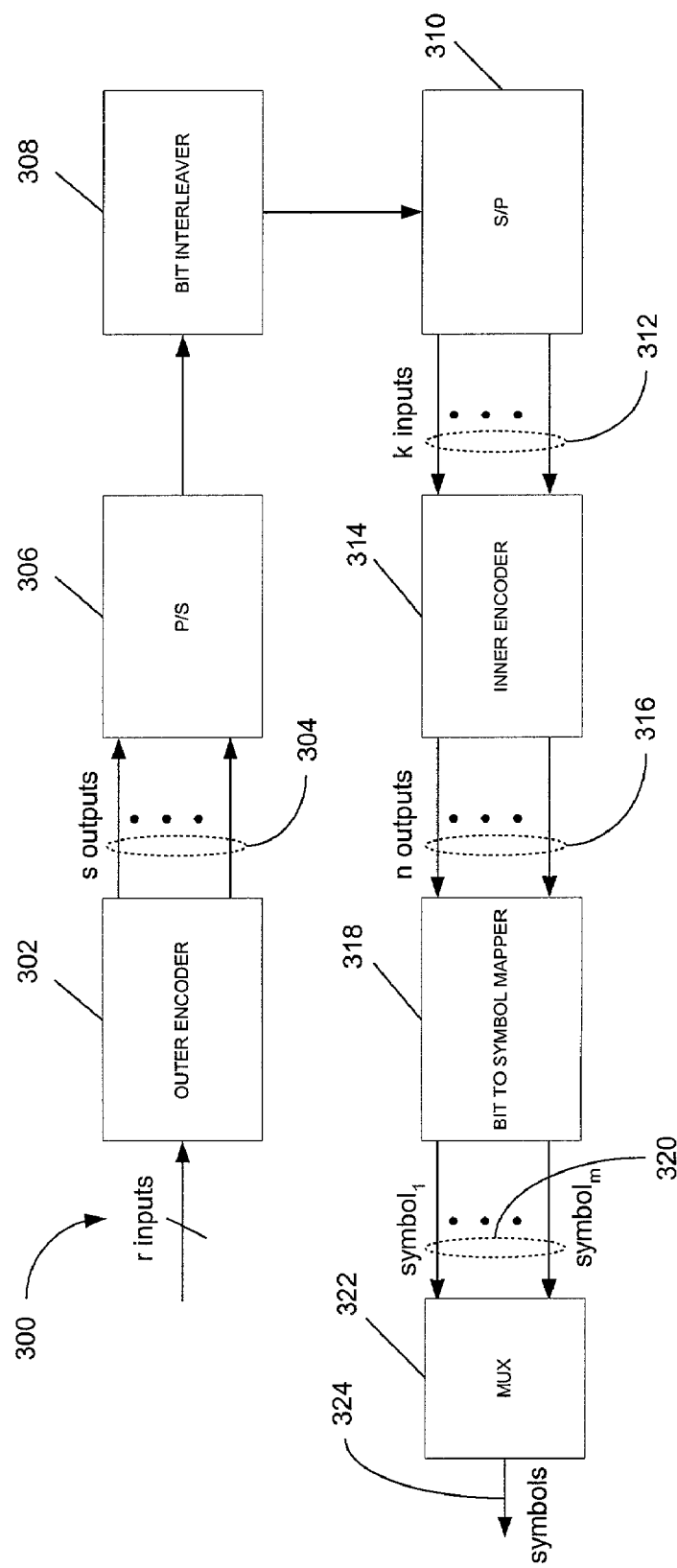
FIG. 3 is a block diagram of an encoder which corresponds to the decoder of FIG. 1.

As illustrated in FIG. 3, the encoder comprises the series combination of outer encoder module 302, parallel-to-serial converter 306, bit interleaver 308, serial-to-parallel converter 310, inner encoder module 314, bit to symbol mapper 318, and symbol multiplexor 322. As shown, outer encoder module 302 is assumed to be a rate r/s convolutional encoder, receiving in series r input bits over one or more signal lines 300, and producing therefrom s parallel output bits over one or more signal lines 304, where both r and s are integers of one or more. Parallel-to-serial (P/S) converter 306 serializes the s parallel bits output by outer encoder module 302, bit interleaver 308 interleaves these bits, and serial-to-parallel converter 310 converts the serial bit stream from interleaver 308 into successive renditions of k bits each. Inner encoder module 314 is assumed to be a rate k/n convolutional encoder, receiving in parallel over one or more signal lines 312 k input bits and producing therefrom in parallel n output bits on one or more signal lines 316, where both k and n are integers of one or more. Bit to symbol mapper 318 converts each n bit rendering from inner encoder module 314 into m symbols, where m is also an integer of one or more. If the symbols are represented in quadrature form, the mapper 318 may output the m symbols in the form of 2m symbol components for each n bit rendering from module 314. The m symbols may then be serialized onto signal line 324 through multiplexor 322. If the symbols are represented in quadrature form, the 2m symbol components may be serialized onto signal line 324 two symbol components at a time.

Figure 4A:
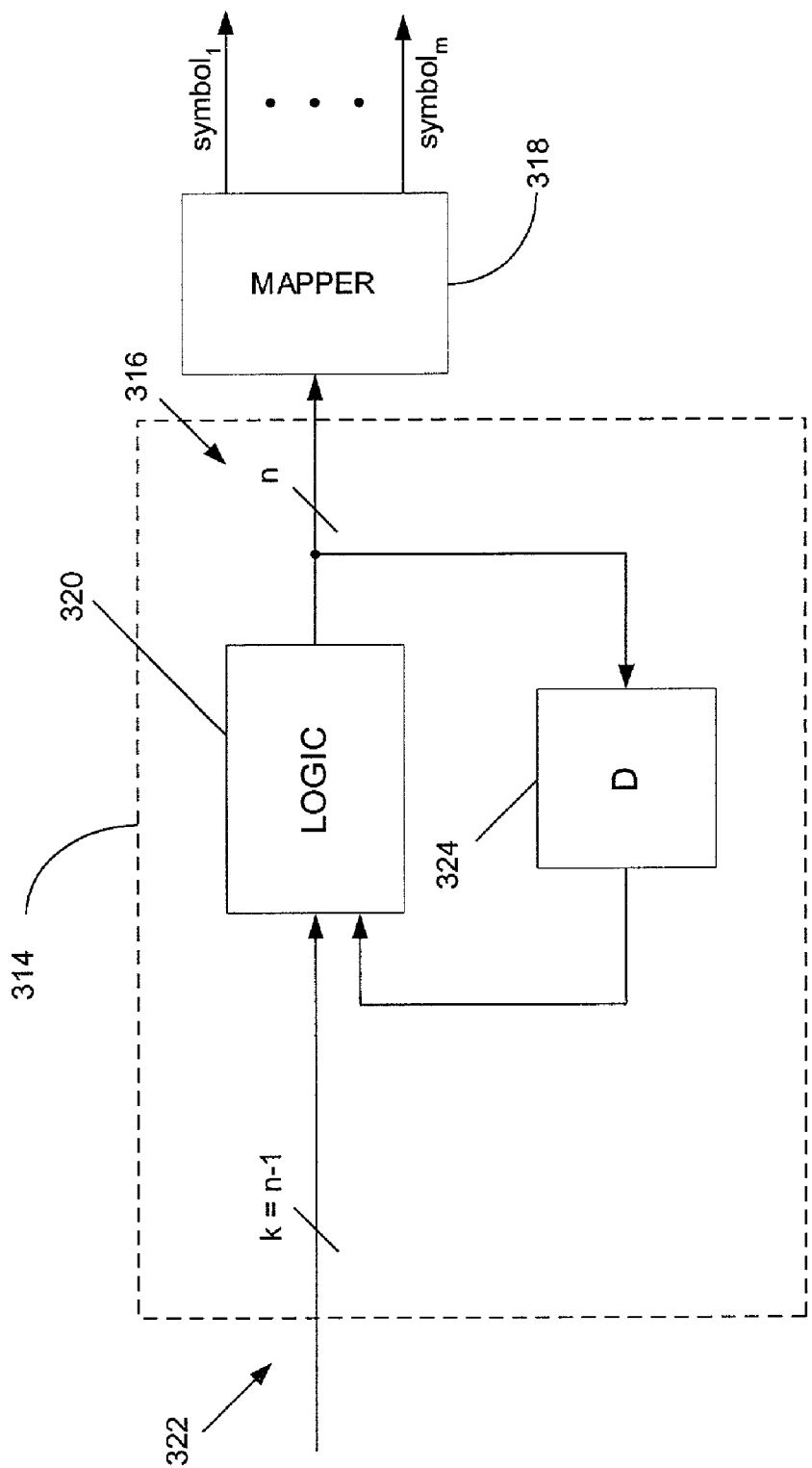
FIG. 4A is a block diagram of one example of the inner encoder module of the encoder of FIG. 3.

An example of inner encoder module 314 and bit to symbol mapper 318 is illustrated in FIG. 4A. As illustrated, in this example, module 314 comprises a rate k/n convolutional encoder where n=k+1 and where only one storage register is employed. However, it should be appreciated that other examples and embodiments are possible, including examples where n ≠ k+1, where n=k, where n≧k+1, and where more than one storage register is employed. Therefore, the inclusion of this example should not be construed as limiting.

Module 314 in this example comprises logic 320 and storage register 324. The k inputs to module 314, identified with numeral 322, are input to logic 320. Another input to logic 320 is formed from the output of storage register 324. The n outputs of module 314, identified with numeral 316, are output from logic 320. One or more of these n outputs may comprise one of the k inputs passed through unaltered. The n outputs are of module 314 are input to mapper 318.

Figure 4C:
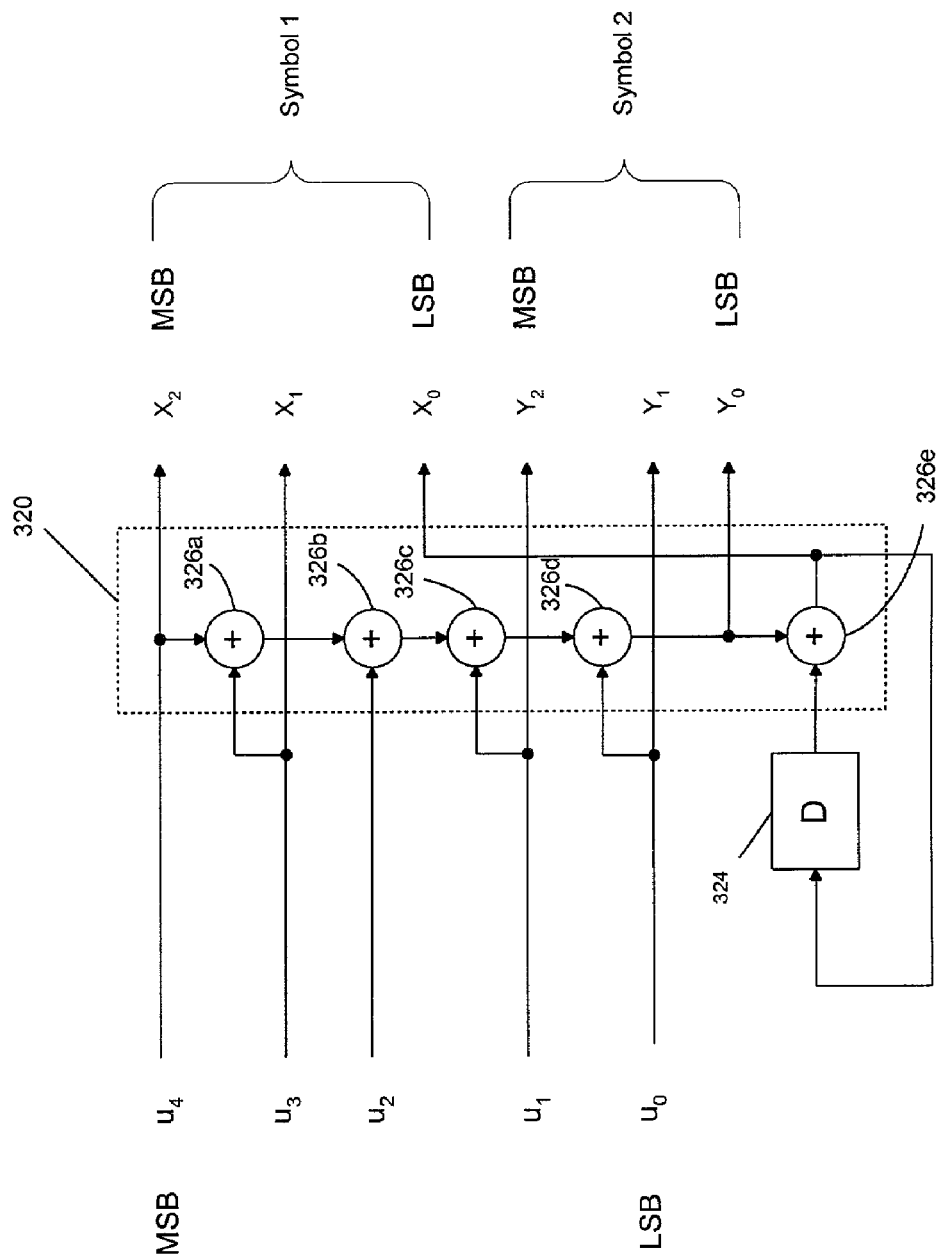
FIG. 4C is a block diagram of one example implementation of the inner encoder portion of the module of FIG. 4A.
Figure 5:
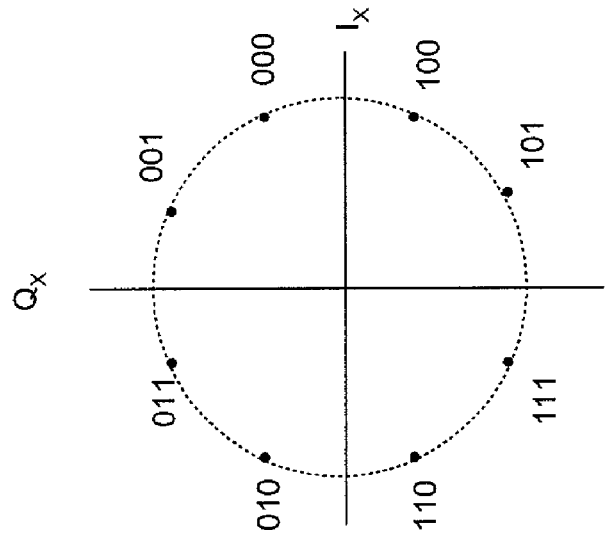
FIG. 5 are constellations illustrating one example of a four dimensional bit to 8-PSK symbol mapping.
Figure 5:
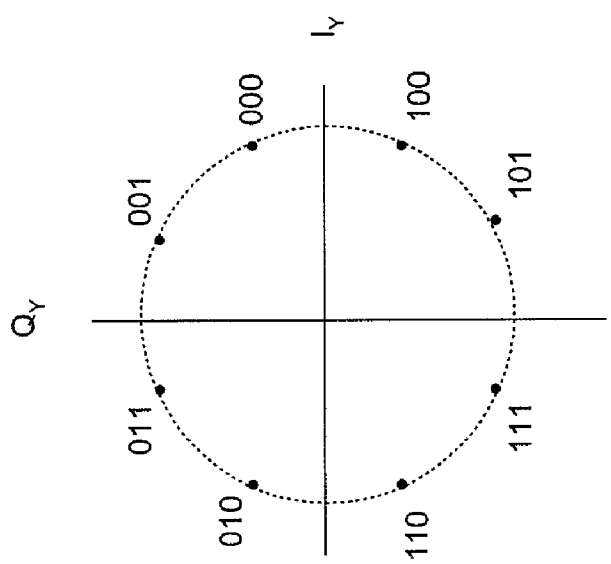

Consider a particular implementation of the particular inner encoder module 314 illustrated in FIG. 4A where k=5. Such an implementation is illustrated in FIG. 4C. As illustrated, logic 320 comprises five two-input exclusive OR modules 326a, 326b, 326c, 326d, and 326e (or equivalently modulo 2 modules. Four of the input bits, $u_0$, $u_1$, $u_3$, and $u_4$, are passed through unaltered to respectively form output bits $Y_1$, $Y_2$, $X_1$, and $X_2$. One of the output bits, $Y_0$, is derived from the modulo two addition of all five input bits, $u_0$, $u_1$, $u_2$, $u_3$, and $u_4$. Another of the output bits, $X_0$, is derived from the modulo two addition of $Y_0$ and the output of storage register 324. In this particular implementation, mapper 318 may map each 6 bit output of inner encoder module 314 into two 8-PSK symbols. As illustrated, the output bits $X_0$, $X_1$, and $X_2$ are mapped into a first symbol, and the output bits $Y_0$, $Y_1$, and $Y_2$ are mapped into a second symbol. One example of such a mapping is illustrated in FIG. 5. In this particular example, each 3 bit grouping within the 6 bit output is mapped into a separate 8-PSK symbol. Moreover, a Gray scale mapping is employed, whereby the 3 bit groupings for adjacent symbols differ by a single bit. The I and Q components for the first symbol may be represented as $I_X$ and $Q_X$, and the I and Q components for the second symbol may be represented as $I_Y$ and $Q_Y$. It should be emphasized that this particular implementation is provided by way of illustration only, and that other examples are possible in which any number of bit groupings or subgroupings are mapped into one or more MPSK or QAM symbols, including BPSK, QPSK, 8-PSK, 16-QAM, 64-QAM, and beyond.

Turning back to FIG. 1, the discussion of the operation of the decoder there illustrated will be continued. Besides the m symbols which are input on one or more signal lines 100, inner decoder module 102 receives as an input over one or more signal lines 116 a priori probabilities of each of the k input bits to the inner encoder module 314 of FIG. 3. Responsive to this information, inner decoder module 102 outputs on one or more signal lines 104 the extrinsic probabilities of each of the k input bits to the inner encoder module 314. In one embodiment, these extrinsic probabilities may be derived from log likelihood ratios that comprise soft estimates of these input bits.

De-interleaver 106 receives the k extrinsic probabilities and de-interleaves them to form a priori probabilities of each of the s coded bits output from the outer encoder module 302 in FIG. 3. Responsive to this information, outer decoder module 110 outputs on one or more signal lines 112 extrinsic probabilities of the s coded bits output from the outer encoder module 302 in FIG. 3. (The other output of outer decoder module 110 comprises estimates of the r input bits to outer encoder module 302.) Again, these s extrinsic probabilities may be derived from soft estimates of the coded bits output from outer encoder module 302.

Figure 4B:
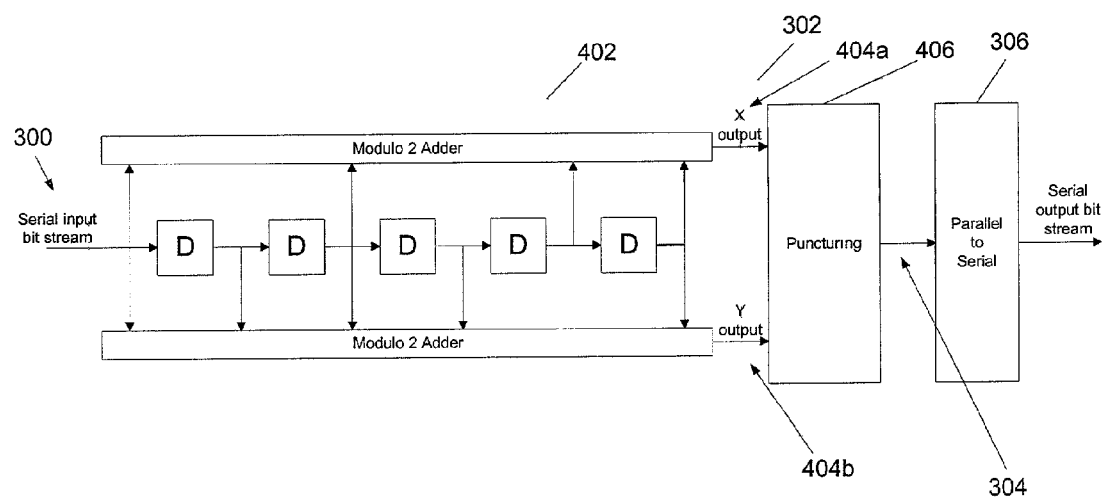
FIG. 4B is a block diagram of one example of the outer decoder module of the encoder of FIG. 3.

An example of outer encoder module 302 and parallel-to-serial converter 308 is illustrated in FIG. 4B. As illustrated, in this example, module 302 comprises a non-systematic, non-recursive rate 1/2 convolutional encoder 402 employing 5 storage registers (and therefore having a corresponding trellis representation which has 32 states). In addition, puncturing logic 406 is included for providing suitable puncturing so that an overall rate of r/s is obtained. Referring to the topmost output bit from the encoder 402 as X(identifying numeral 404a), and the bottom bit from the encoder 402 as Y (identifying numeral 404b), the following table identifies the puncturing patterns that will achieve overall rates of 4/5, 5/6, 8/9, and 9/10:

| PUNCTURING PATTERNS | | | |
|---|---|---|---|
| | | X | Y |
| RATE | 4/5 | 1000 | 1111 |
| | 5/6 | 10000 | 11111 |
| | 8/9 | 11100010 | 10011101 |
| | 9/10 | 100001111 | 111110000 |

However, it should be appreciated that other examples and embodiments are possible, including examples where encoder is other than a rate 1/2 encoder, or is systematic, or is recursive, where puncturing logic is avoided or the puncturing pattern is different or other rates are achieved from the puncturing, or and where more or less than five storage registers are employed. Therefore, the inclusion of this example should not be construed as limiting.

Referring back to FIG. 1, the s extrinsic probabilities from outer decoder module 110 are input to interleaver 114, which interleaves these values to produce, on one or more signal lines 116, the a priori probabilities of the k input bits to the inner decoder module 314. These k a priori probabilities form the second input to inner decode module 102.

The decoder illustrated in FIG. 1 may iterate one or more additional times so that, at the conclusion of these iterations, the estimates of the r input bits to the outer encoder module 302 output from outer decoder module 110 may be considered reliable. Thus, at the conclusion of these iterations, the estimates of the r input bits may be taken from the outer encoder module 302.

Figure 2A:
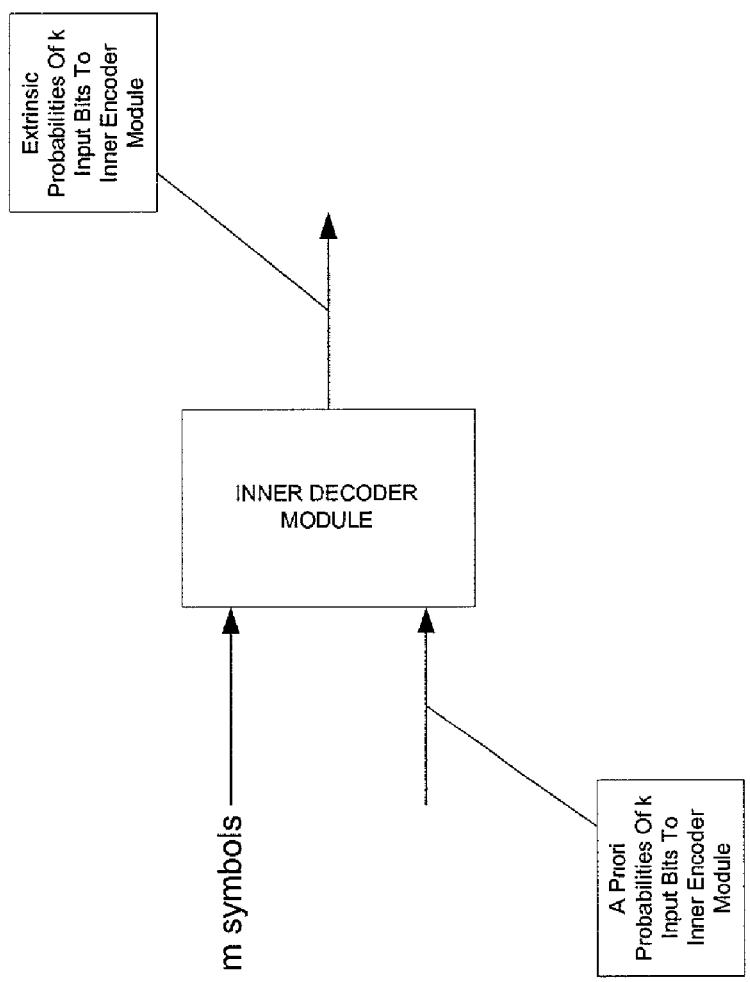
FIG. 2A is a block diagram of the inner decoder module of the decoder of FIG. 1.

The inner decoder module 102 of FIG. 1 is shown as a standalone module in FIG. 2A. As shown, this module receives as inputs the m symbols output by mapper 318, and the a priori probabilities of the k input bits to inner encoder module 314 which gave rise to the m symbols, and outputs extrinsic probabilities for each of the k input bits.

Figure 2B:
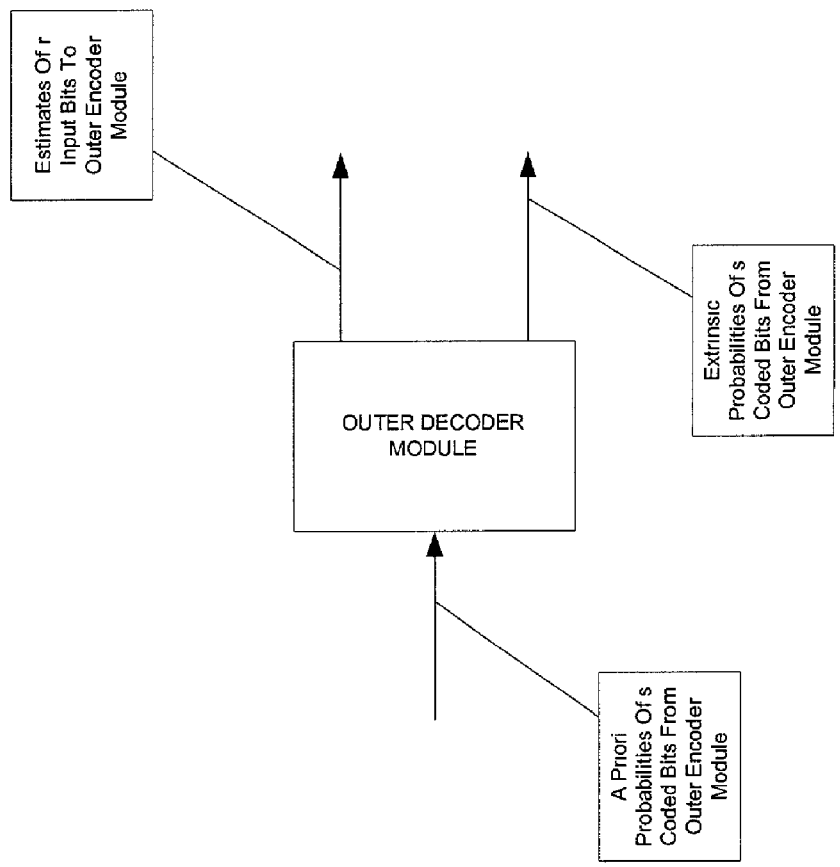
FIG. 2B is a block diagram of the outer decoder module of the decoder of FIG. 1.

The outer decoder module 110 of FIG. 1 is shown as a standalone module in FIG. 2B. As shown, this module receives as inputs the a priori probabilities of the r output bits from outer encoder module 302, and outputs extrinsic probabilities for these r output bits. It also estimates of the s input bits to outer encoder module 302. It is this outer decoder module which provides an example application for the system configured in accordance with the subject invention.

In this example, the outer decoder module 110 may comprises one or more forward decoding engines and one or more backward decoding engines, each embodying the system of the invention. These decoding engines may operate concurrently to process incoming blocks of symbols.

Figure 6:
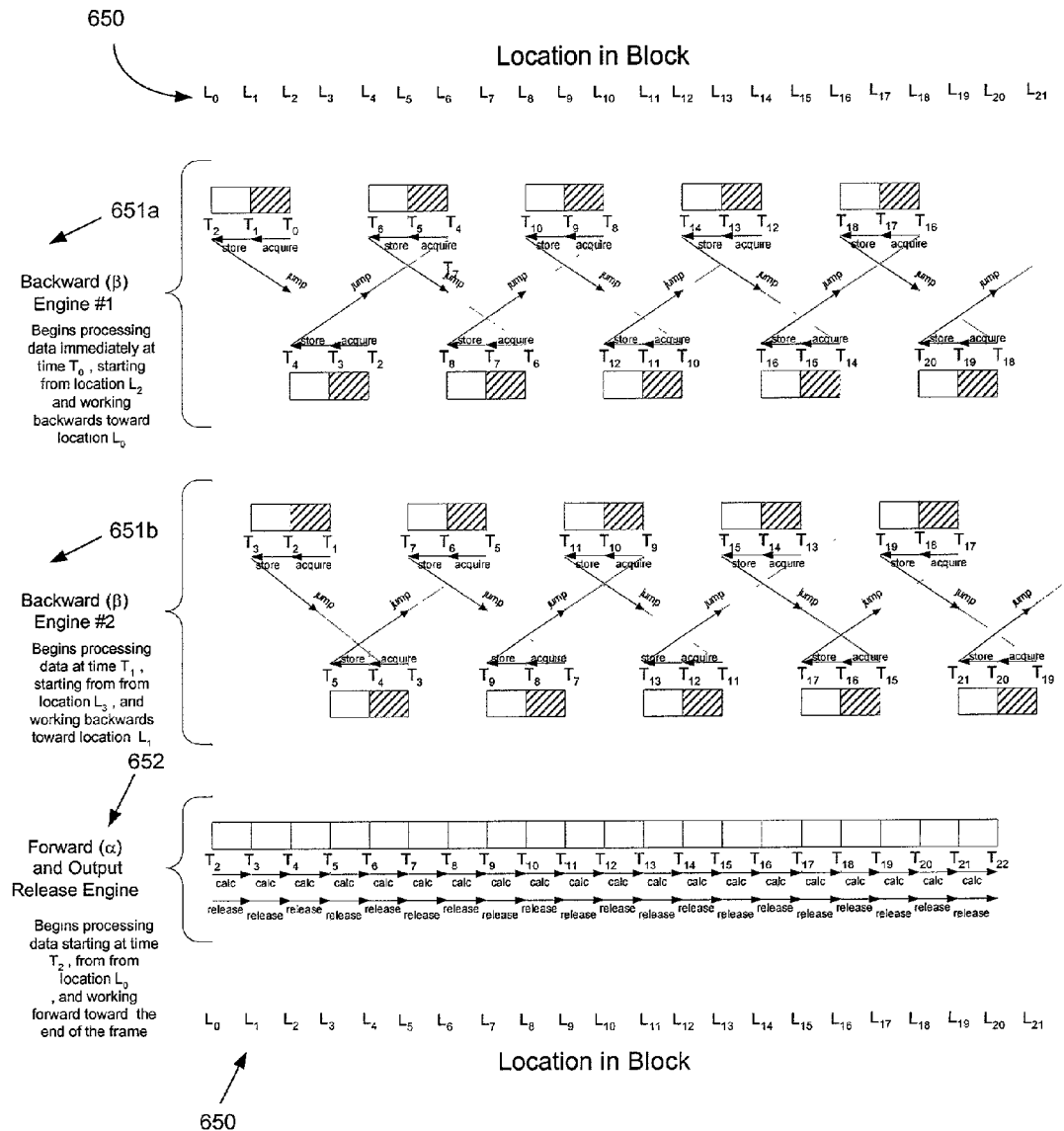
FIG. 6 is a timing diagram illustrating concurrent operation of forward and backward engines according to one example application of a decoding engine according to the invention.

Referring to FIG. 6, in one example, the outer decoder module 110 comprises two backward engines, identified with numerals 651a and 651b, and one forward engine 652, each of which are configured according to the invention. The engines may operate concurrently on portions (sub-blocks) of a block of encoded bits within a movable sliding window according to the timing diagram illustrated in FIG. 6. The locations within the block of encoded bits being processed are identified with numeral 650. The sub-blocks are the areas which are demarcated by the locations $L_0$, $L_1$, etc.

The backward engines can begin operating at any portion of the block and will eventually begin producing reliable results, i.e., reliable backward state probabilities, after a certain amount of processing. A rule of thumb is that the backward engines require about 5–6 constraint lengths of processing before they begin producing reliable results. These 5–6 constraint lengths are referred to as the traceback length. Processing by the backward engines over the traceback length is referred to in the figure with the "acquire" label. The period over which the backward engines produce reliable results is referred to in the figure with the "store" label. That is because these results are typically stored in a volatile memory such as RAM. Processing during the traceback length will hereinafter be referred to as "acquire" processing and the subsequent phase in which reliable results are produced will be referred to as "reliable" or "store" processing.

In FIG. 6, it can be seen that the traceback length is equal to the store period over which the backward engine produces reliable results, and both are equal to one sub-block length. However, it should be appreciated that embodiments are possible in which the traceback length is different from the store length, and in which one or both of traceback and store lengths are greater than one sub-block.

The timing and manner in which the backward engines perform their operations in the particular example are indicated in the figure. For example, during time $T_0$–$T_1$, backward engine 651a performs acquire processing of sub-block $L_1$–$L_2$, and during time $T_1$–$T_2$, it performs reliable processing of sub-block $L_0$–$L_1$. Concurrently with these functions, backward engine 651b, during time $T_1$–$T_2$, performs acquire processing of sub-block $L_2$–$L_3$, and during time $T_2$–$T_3$, performs reliable processing of sub-block $L_1$–$L_2$.

Meanwhile backward engine 651a, during time $T_2$–$T_3$, performs acquire processing of sub-block $L_3$–$L_4$, followed, during time $T_3$–$T_4$, by reliable processing of sub-block $L_2$–$L_3$. Concurrently with these functions, backward engine 651b, during time $T_3$–$T_4$, performs acquire processing of sub-block $L_4$–$L_5$, and during time $T_4$–$T_5$, performs reliable processing of sub-block $L_3$–$L_4$.

The backward engines then continue to operate in tandem as illustrated in the figure until the entire block has been processed. Note that, in this exemplary embodiment, reliable results for the sub-blocks are sequentially produced in the same order as the physical sub-blocks. That is to say, during $T_1$–$T_2$, reliable results are produced (by engine 651a) for sub-block $L_0$–$L_1$. Then, during time $T_2$–$T_3$, reliable results are produced (by engine 651b) for sub-block $L_1$–$L_2$. This is followed by time $T_3$–$T_4$, when reliable results are produced (by engine 651a) for sub-block $L_2$–$L_3$. This is followed by time $T_4$–$T_5$, when reliable results are produced (by engine 651b) for sub-block $L_3$–$L_4$. The process then continues in this fashion as illustrated in the figure.

The forward engine 652 operates in tandem with the completion of processing of reliable backward state probabilities for the various sub-blocks. That is to say, after reliable backward state probabilities are determined for sub-block $L_0$–$L_1$ during time $T_1$–$T_2$, the forward engine 652 performs, during time $T_2$–$T_3$, the calculation of forward state probabilities for sub-block $L_0$–$L_1$. At the same time, or synchronized with the calculation of the forward state probabilities, the forward engine 652 may use the immediately available forward state probabilities and the stored backward state probabilities to calculate and release extrinsic outputs and/or bit estimates for sub-block $L_0$–$L_1$. Then, after reliable backward state probabilities are determined for sub-block $L_1$–$L_2$ during time $T_2$–$T_3$, the forward engine 652 performs, during time $T_3$–$T_4$, the calculation of forward state probabilities for sub-block $L_1$–$L_2$. At the same time, or synchronized with the calculation of the forward state probabilities, the forward engine 652 may calculate and release extrinsic outputs and/or bit estimates for sub-block $L_1$–$L_2$. The process then continues in the same manner until extrinsic outputs and/or bit estimates for the entire block have been released. Note that the order in which the forward engine 652 processes sub-blocks to compute forward state probabilities and release extrinsic outputs and/or bit estimates in this example is the same as the physical order of the sub-blocks.

Note also that the latency in this example, in terms of traceback lengths, is equal to four. This is the delay between the time the system began acquire processing of a sub-block and the time the system completed the release of extrinsic outputs and/or bit estimates for that sub-block. For example, consider sub-block $L_1$–$L_2$. The system began acquire processing of this sub-block at time $T_0$. Yet, it did not complete the release of extrinsic outputs and/or bit estimates for that sub-block until time $T_4$. Since each time period is assumed equal to a traceback length in this example, the total latency is four traceback lengths.

For additional information on this mode of operation, in which one or more forward and backward engines operate concurrently on sub-blocks within a sliding window, please see co-pending U.S. patent application Ser. No. 09/629,122, filed Jul. 31, 2000, which is hereby fully incorporated by reference herein as though set forth in full.

DESCRIPTION OF EMBODIMENTS OF THE INVENTION

Figure 7A:
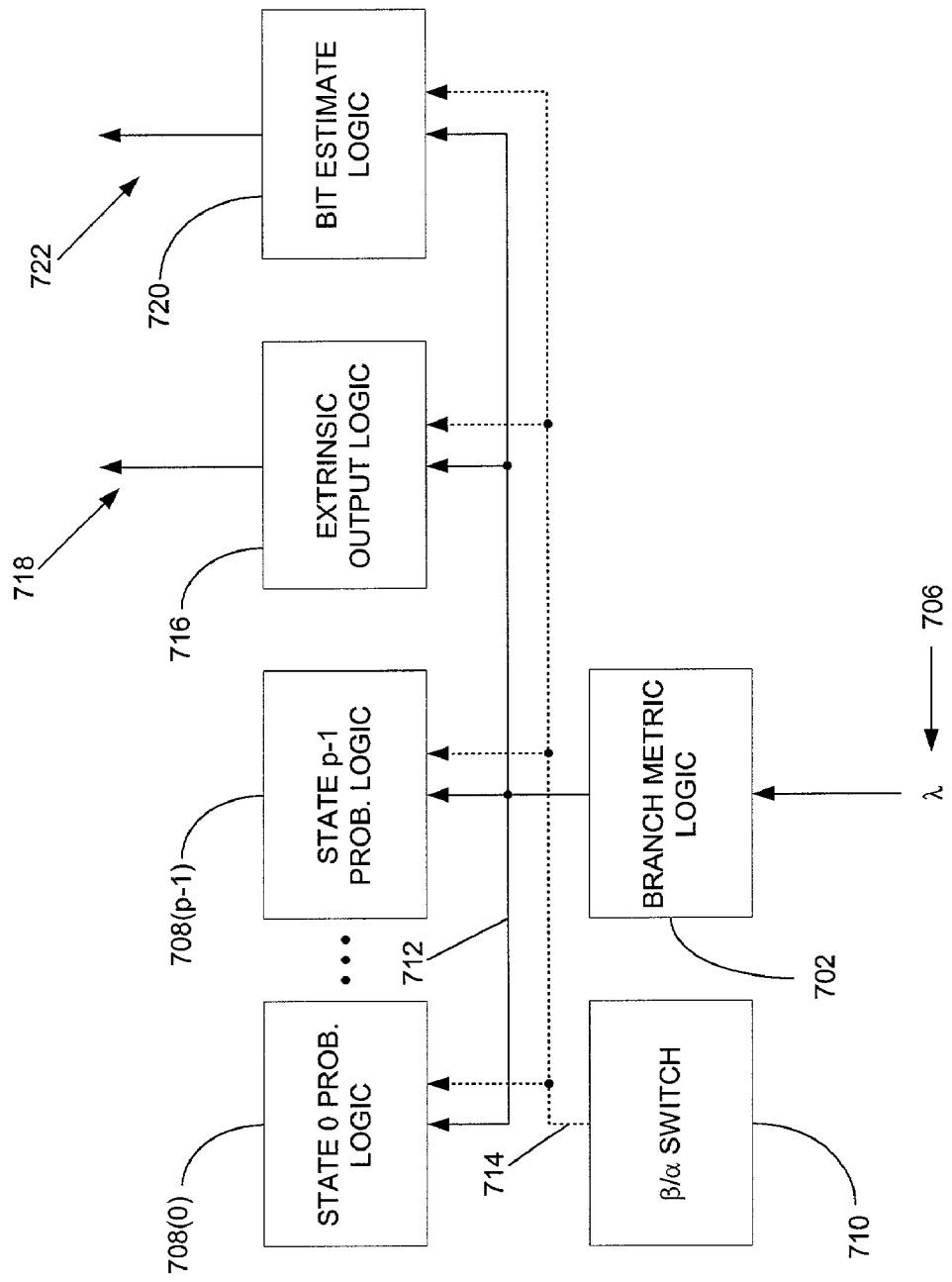
FIG. 7A is a block diagram of a first embodiment of a system for decoding trellis coded bits according to the invention.

A first embodiment of a decoding system according to the invention is illustrated in FIG. 7A. In this embodiment, a priori probabilities for each of s encoder output bits, identified in the figure with numeral 706, are input to the system, where s is an integer of one or more. The s encoder output bits may result from passing r source bits through a rate r/s convolutional encoder, where r and s are integers of one or more which need not be the same and may in fact differ. (One example of a rate r/s convolutional encoder is the combination of outer encoder module 302 and parallel-to-serial converter 306 in FIG. 3, but it should be appreciated that the rate r/s convolutional encoder is not limited to serving as the outer encoder in a SCTCM encoder, and that other applications are possible, including where the rate r/s convolutional encoder operates in a standalone mode.) The coded bits, either directly or after further encoding into symbols, may also have been transmitted over a wireless or wireline communications channel prior to being input to the system.

Responsive to this input, branch metric logic 702 within the system computes branch metrics for one or more of the branches in a trellis representation which corresponds to the rate r/s convolutional encoder giving rise to the s coded output bits that the a priori probabilities 706 relate to. Generally speaking, the branch metric for a branch involves a measure of the correlation between the s output bits corresponding to the branch and the s a priori probabilities input to the system.

The number of states in the trellis at a particular point in time may be represented as p, where p is equal to two raised to the 1th power, where 1 is the number of storage registers in the rate r/s encoder. Thus, in the example of FIG. 4B, where the encoder has five storage registers, there will be 32 states in the trellis representation at a particular time.

A plurality of logic modules, identified with numerals 708(0), 708(1), . . . , 708($p$–1), are provided for computing backward or forward state probabilities for the states in the trellis. In one embodiment, p modules are provided, one for each of the p states in the trellis. These p modules are configured to compute in parallel the state probabilities of each of the p states in the trellis. However, it should be appreciated that other embodiments are possible where less or more than p modules are provided, where the modules compute in parallel less than p of the state probabilities, or where some or all of the state probabilities are computed in parallel.

Optionally, the system may function as either a forward engine (forward recursion mode) or as a backward engine (backward recursion mode). In one embodiment, β/α switch 710 is provided to indicate the particular mode of operation in which the system is functioning, whether forward recursion mode or backward recursion mode. In this embodiment, each of the p modules 708(0), 708(1), . . . 708($p$–1) may be configured to recursively compute forward or backward state probabilities depending on the state of β/α switch 710, which may be indicated to each of the modules over one or more signal lines 714. If the switch 710 indicates the backward (or β) mode of operation, the modules may respond by computing backward state probabilities. Conversely, if the switch 710 indicates the forward (or α) mode of operation, the modules may respond by computing forward state probabilities.

If the system is functioning in backward recursion mode, the modules recursively compute, in parallel, a backward state probability for one or more of the p states. The backward state probabilities may be computed responsive to one or more of the branch metrics and one or more of the state probabilities of successor states.

If the system is functioning as a forward recursion engine, the modules recursively compute, in parallel, a forward state probability for one or more of the p states. The forward state probabilities may be computed responsive to one or more of the branch metrics and one or more of the state probabilities of predecessor states.

Extrinsic output logic 716 computes extrinsic outputs for each of the s encoder output bits responsive to one or more of the forward and backward state probabilities, one or more of the branch metrics, and one or more of the a priori probabilities. These extrinsic outputs may be output over one or more signal lines 718.

Bit estimate logic 720 computes estimates of the r encoder input bits responsive to one or more of the forward and backward state probabilities, and, optionally, one or more of the branch metrics.

In one embodiment, the extrinsic output logic 716 and the bit estimate logic 720 may be enabled only when the system is functioning as a forward engine. In this embodiment, the mode of operation of the system, whether forward or backward, may be provided to the logic 716 and to the logic 720 over one or more signal lines 714. If the switch indicates a backward mode of operation, the logic 716 and the logic 720 may be disabled. If the switch indicates a forward mode of operation, the logic 716 and the logic 720 may be enabled.

In one implementation, the backward state probability for a state may be computed by determining, for each branch exiting the state, a branch value based on the branch metric for the branch and the backward state probability of the terminating state of the branch, and then determining the backward state probability for the state by performing a group operation on all these values.

In one implementation example, the backward state probability for a state may be derived from the MAX* of the branch values for the branches exiting the state. The MAX* of two values A and B may be represented as follows:

$$\text{MAX}^*(A,B) = \text{MAX}(A,B) + \ln(1 + \exp(-|A-B|)) \qquad (1)$$

Since the MAX* operation is associative, the MAX* of three or more values in a group may be performed through successive application of the MAX* operation on pairs of values. For example, the MAX* of A, B, and C may be computed as follows:

$$\text{MAX}^*(A,B,C) = \text{MAX}^*(\text{MAX}^*(A,B),C) \quad (2)$$

Similarly, the MAX* of A, B, C, and D may be computed as follows:

$$\text{MAX}^*(A,B,C,D) = \text{MAX}^*(\text{MAX}^*(A,B,C),D) \quad (3)$$

Figure 8A:
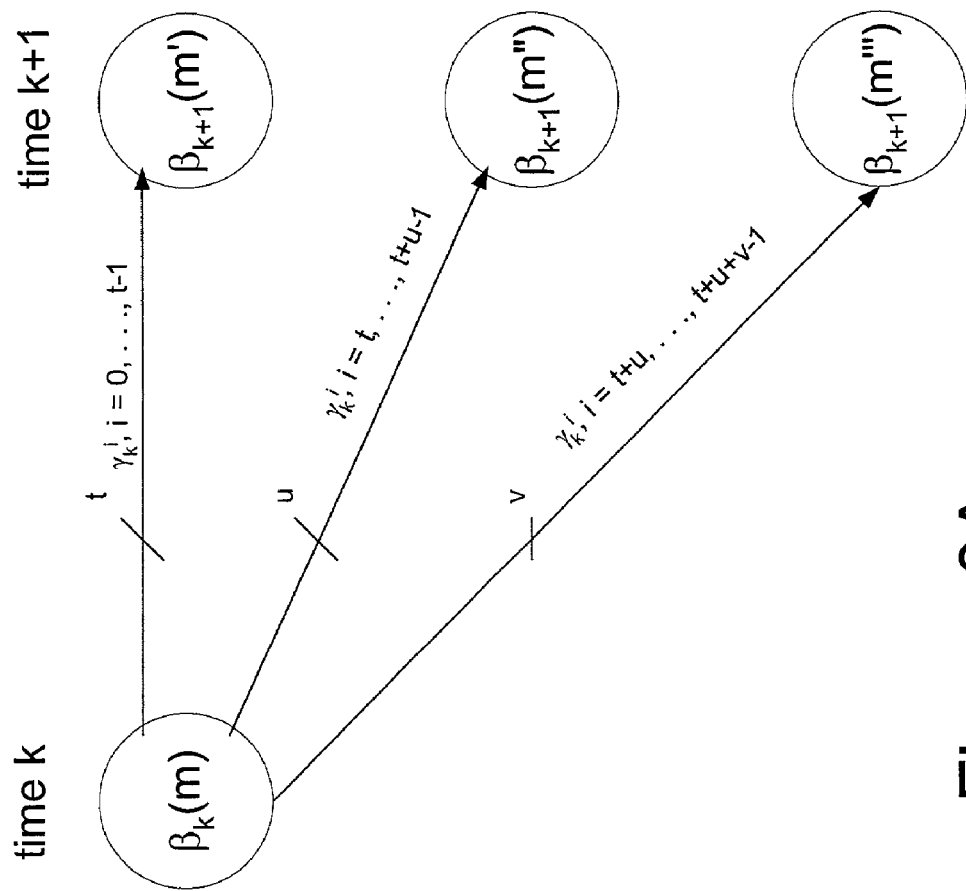
FIG. 8A is a portion of trellis illustrating the computation of backward state probabilities according to an embodiment of the invention.

The foregoing may be illustrated in FIG. 8A in the context of an example in which the backward state probability for state m at time k, $\beta_k(m)$, is to be computed. It is assumed that t branches originate from state m at time k and terminate at state m' at time k+1, that u branches originate from state m at time k and terminate at state m'' at time k+1, and that v branches originate from state m at time k and terminate at state m''' at time k+1.

The backward state probability for state m' at time k+1, $\beta_{k+1}(m')$, the backward state probability for state m'' at time k+1, $\beta_{k+1}(m'')$, and the backward state probability for state m''' at time k+1, $\beta_{k+1}(m''')$ are all assumed known. In addition, the branch metrics for the t branches originating at state m at time k and terminating at state m' at time k+1, $\gamma k^i$, $0 \leq i \leq t-1$; the branch metrics for the u branches originating at state m at time k and terminating at state m'' at time k+1, $\gamma k^i$, $t \leq i \leq t+u-1$; and the branch metrics for the v branches originating at state m at time k and terminating at state m''' at time k+1, $\gamma k^i$, $t+u \leq i \leq t+u+v-1$, are all assumed known.

Values may be derived for the branches originating from state m at time k from the branch metrics for the branches and the backward state probabilities, $\beta_{k+1}(m')$, $\beta_{k+1}(m'')$, and $\gamma_{k+1}(m''')$, for the states at which the branches terminate at time k+1.

In one implementation example, the value for one of the t branches terminating at state m' at time k+1 may be computed by adding to the branch metric of the branch, $\gamma k^i$, $0 \leq i \leq t-1$, the backward state probability of the state m' at time k+1, $\beta_{k+1}(m')$; the value for one of the u branches terminating at state m'' at time k+1 may be computed by adding to the branch metric of the branch, $\gamma k^i$, $t \leq i \leq t+u-1$, the backward state probability of the state m'' at time k+1, $\beta_{k+1}(m'')$; and the value for one of the v branches terminating at state m''' at time k+1 may be computed by adding to the branch metric of the branch, $\gamma k^i$, $t+u \leq i \leq t+u+v-1$, the backward state probability of the state m' at time k+1, $\beta_{k+1}(m''')$.

The backward state probability $\beta_k(m)$ may then be derived from the MAX* of these values. Mathematically, this operation may be expressed as $\beta_k(m) = \text{MAX}^*[(\beta_{k+1}(m')+(\gamma k^1, 0 \leq i \leq t-1)), (\beta_{k+1}(m'')+(\gamma k^i, t \leq i \leq t+u-1)), (\beta_{k+1}(m''')+(\gamma k^i, t+u \leq i \leq t+u+v-1))]$.

In one implementation, the forward state probability for a state may be computed by determining, for each branch terminating at the state, a branch value based on the branch metric for the branch and the forward state probability of the originating state of the branch, and then determining the forward state probability for the state by performing a group operation on all these values. In one implementation example, the forward state probability for a state may be derived from the MAX* of the values for the branches exiting the state.

Figure 8B:
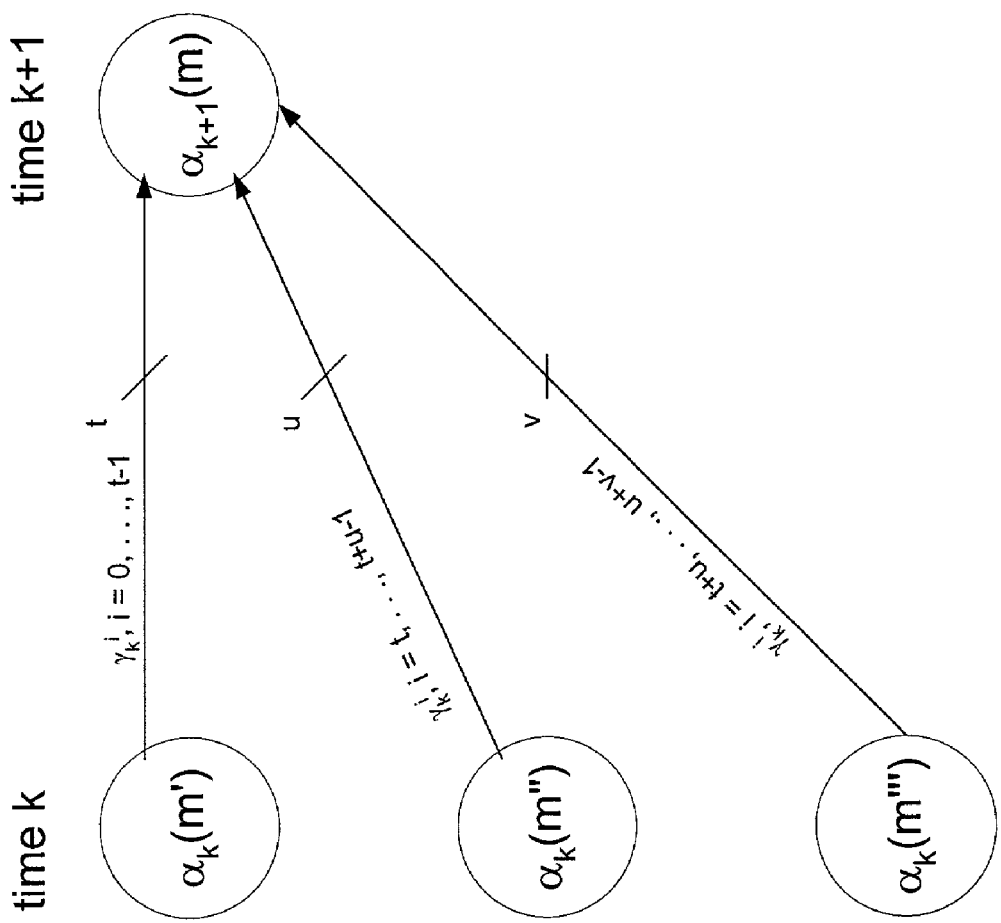
FIG. 8B is a portion of a trellis illustrating the computation of forward state probabilities according to one embodiment of the invention.

The foregoing may be illustrated in FIG. 8B in the context of an example in which the forward state probability for state m at time k+1, $\alpha_{k+1}(m)$, is to be computed. It is assumed that t branches originate from state m' at time k and terminate at state m at time k+1, that u branches originate from state m'' at time k and terminate at state m at time k+1, and that v branches originate from state m''' at time k and terminate at state m at time k+1.

The forward state probability for state m' at time k, $\alpha_k(m')$, the forward state probability for state m'' at time k, $\alpha_k(m'')$, and the forward state probability for state m''' at time k, $\alpha_k(m''')$ are all assumed known. In addition, the branch metrics for the t branches originating at state m' at time k and terminating at state m at time k+1, $\gamma k^i$, $0 \leq i \leq t-1$; the branch metrics for the u branches originating at state m'' at time k and terminating at state m at time k+1, $\gamma k^i$, $t \leq i \leq t+u-1$; and the branch metrics for the v branches originating at state m''' at time k and terminating at state m at time k+1, $\gamma k^i$, $t+u \leq i \leq t+u+v-1$, are all assumed known.

Values may then be derived for the branches terminating at state m at time k+1 from the branch metrics for the branches and the forward state probabilities, $\alpha_k(m')$, $\alpha_k(m'')$, and $\alpha_k(m''')$, for the states at which the branches originate at time k.

In one implementation example, the value for one of the t branches originating from state m' at time k may be computed by adding to the branch metric of the branch, $\gamma k^i$, $0 \leq i \leq t-1$, the forward state probability of the state m' at time k, $\alpha_k(m')$; the value for one of the u branches originating from state m'' at time k may be computed by adding to the branch metric of the branch, $\gamma k^i$, $t \leq i \leq t+u-1$, the forward state probability of the state m'' at time k, $\alpha_k(m'')$; and the value for one of the v branches originating from state m''' at time k may be computed by adding to the branch metric of the branch, $\gamma k^1$, $t+u \leq i \leq t+u+v-1$, the forward state probability of the state m''' at time k, $\alpha_k(m''')$.

The forward state probability $\alpha_{k+1}(m)$ may then be derived from the MAX* of these values. Mathematically, this may be expressed as $\alpha_{k+1}(m) = \text{MAX}^*[(\alpha_k(m')+(\gamma k^i, 0 \leq i \leq t-1)), (\alpha_k(m'')+(\gamma k^i, t \leq i \leq t+u-1)), (\alpha_k(m''')+(\gamma k^i, t+u \leq i \leq t+u+v-1))]$.

Turning back to FIG. 7A, the extrinsic outputs in this implementation may be computed one bit at a time. A branch value for each of the branches in a particular portion of the trellis may be derived responsive to the forward state probability of the originating state of the branch, the branch metric for the branch, the a priori probability for the bit, and the backward state probability of the terminating state of the branch. Then, a first value may be derived by performing a group operation, such as MAX*, on the branch values for all the branches which imply release of a logical '1' for the bit in question. Similarly, a second value may be derived by performing a group operation, such as MAX*, on the branch values for all the branches which imply release of a logical '0' for the bit in question. The extrinsic output for the bit in question may then be derived from the first and second values. This process may then be repeated for each of the other s output bits.

In one implementation example, the first value may be derived from the MAX* of the branch values for the branches which imply release of a logical '1' for the bit in question, and the second value may be derived from the MAX* of the branch values for the branches which imply release of a logical '0' for the bit in question. An extrinsic output for the bit may then be derived from the difference between the first and second values. Again, this process may then be repeated for each of the s output bits.

Similarly, the bit estimates in this implementation may be computed one bit at a time. A branch value for each of the branches in a particular portion of the trellis may be derived responsive to the forward state probability of the originating state of the branch, the branch metric for the branch, and the backward state probability of the terminating state of the branch. Then, a first value may be derived by performing a group operation, such as MAX*, on all the branches which imply release of a logical '1 ' for the bit in question. Similarly, a second value may be derived by performing a group operation, such as MAX*, on all the branches which imply release of a logical '0' for the bit in question. A third value for the bit in question may then be derived from the first and second values. An estimate for the bit may then be derived by comparing the third value to a threshold. This process may then be repeated for each of the other r input bits.

In one implementation example, all the branches which terminate at a state imply release of the same value for the bit in question, either logical '1'or logical '0'. In this implementation example, state values may be derived, for each of the terminating states, from the sum of the forward and backward state probabilities of the terminating state. The first value may be derived from the MAX* of the state values for the terminating states which imply release of a logical '1' for the bit in question, and the second value may be derived from the MAX* of the state values for the terminating states which imply release of a logical '0' for the bit in question. The third value may then be derived from the difference between the first and second values. An estimate for the bit in question may then be derived from a comparison of the third value with a threshold. If the third value equals or exceeds the threshold, the estimate is set to a logical '1'; if the third value is less than the threshold, the estimate is set to a logical '0'. Again, this process may then be repeated for each of the r input bits.

Figure 8C:
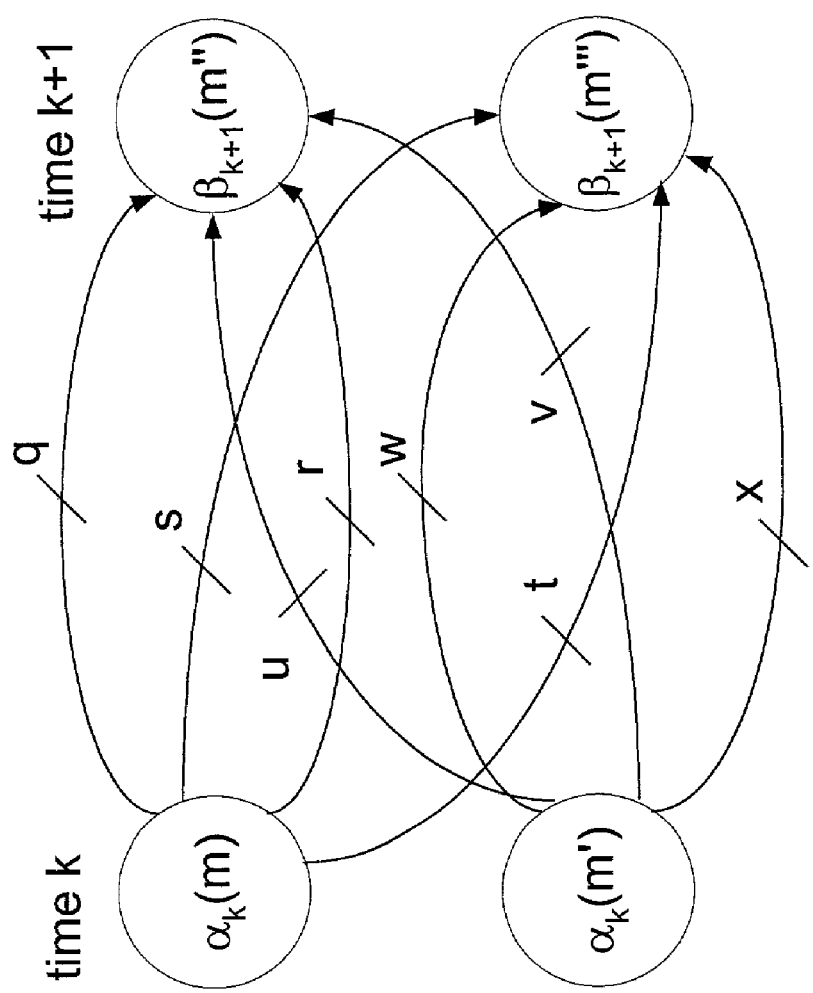
FIG. 8C is a portion of a trellis illustrating the computation of extrinsic outputs according to one embodiment of the invention.

The foregoing processes may be illustrated in the context of an example, illustrated in FIG. 8C, in which the extrinsic output of one for s output bits is to be determined, and an estimate of one of the r input bits is to be determined. The forward state probability for state m at time k, $\alpha_k(k)$, the forward state probability for state m' at time k, $\alpha_k(m')$, the backward state probability for state m" at time k+1, $\beta_{k+1}(m")$, and the backward state probability for state m'" at time k+1, $\beta_{k+1}(m'")$, are all assumed known.

Moreover, it is assumed that there are q branches from state m at time k to state m" at time k+1 which imply a release of a logical "0" for the output bit and logical '0' for the input bit; that r branches from state m at time k to state m" at time k+1 imply a release of a logical "1" for the output bit and logical '0' for the input bit; that s branches from state m at time k to state m'" at time k+1 imply release of a logical "0" for the output bit and logical '1' for the input bit, that t branches from state m at time k to state m'" at time k+1 imply release of a logical "1" for the output bit and logical '1' for the input bit; that u branches from state m' at time k to state m" at time k+1 imply release of a logical "0" for the output bit and logical '0' for the input bit; that v branches from state m' at time k to state m" at time k+1 imply release of a logical "1" for the output bit and logical '0' for the input bit; that w branches from state m' at time k to state m'" at time k+1 imply release of a logical "0" for the output bit and logical '1' for the input bit; and that x branches from state m' at time k to state m'" at time k+1 imply release of a logical "1" for the output bit and logical '1' for the input bit.

It is further assumed that the branch metrics for the q branches from state m at time k to state m" at time k+1, $\gamma k^i$, $0 \leq i \leq q-1$, are known; that the branch metrics for the r branches from state m at time k to state m" at time k+1, $\gamma k^i$, $q \leq i \leq q+r-1$, are known; that the branch metrics for the s branches from state m at time k to state m'" at time k+1, $\gamma k^i$, $q+r \leq i \leq q+r+s-1$, are known; that the branch metrics for the t branches from state m at time k to state m'" at time k+1, $\gamma k^i$ $q+r+s \leq i \leq q+r+s+t-1$, are known; that the branch metrics for the u branches from state m' at time k to state m" at time k+1, $\gamma k^i$, $q+r+s+t \leq i \leq q+r+s+t+u-1$, are known; that the branch metrics for the v branches from state m' at time k to state m" at time k+1, $\gamma k^i$, $q+r+s+t+u \leq i \leq q+r+s+t+u+v-1$, are known; that the branch metrics for the w branches from state m' at time k to state m'" at time k+1, $\gamma k^i$, $q+r+s+t+u+v \leq i \leq q+r+s+t+u+v+w-1$, are known; and that the branch metrics for the x branches from state m' at time k to state m'" at time k+1, $\gamma k^i$, $q+r+s+t+u+v+w \leq i \leq q+r+s+t+u+v+w+x-1$, are known.

The process of determining an extrinsic output for the encoder output bit may begin by determining for each bit values for each of the branches. A branch value may be computed for each of the q branches from state m at time k to state m" at time k+1 by adding to the branch metric for the branch, $\gamma k^i$, $0 \leq i \leq q-1$, minus the a priori probability of the bit, $\lambda_i$, the forward state probability of state m at time k, $\alpha_k(m)$, and the backward state probability of state m" at time k+1, $\beta_{k+1}(m")$. A branch value may be computed for each of the r branches from state m at time k to state m" at time k+1 by adding to the branch metric for the branch, $\gamma k^i$, $q \leq i \leq q+r-1$, minus the a priori probability of the bit, $\lambda_i$, the forward state probability of state m at time k, $\alpha_k(m)$, and the backward state probability of state m" at time k+1, $\beta_{k+1}(m")$.

A branch value may be computed for each of the s branches from state m at time k to state m'" at time k+1 by adding to the branch metric for the branch, $\beta k^i$, $q+r \leq i \leq q+r+s-1$, minus the a priori probability, $\lambda_i$, of the bit, the forward state probability of state m at time k, $\alpha_k(m)$, and the backward state probability of state m'" at time k+1, $\beta_{k+1}(m'")$. A branch value may be computed for each of the t branches from state m at time k to state m'" at time k+1 by adding to the branch metric for the branch, $\gamma k^i$, $q+r+s \leq i \leq q+r+s+t-1$, minus the a priori probability, $\lambda_i$, of the bit, the forward state probability of state m at time k, $\alpha_k(m)$, and the backward state probability of state m'" at time k+1, $\beta_{k+1}(m'")$.

A branch value may be computed for each of the u branches from state m' at time k to state m" at time k+1 by adding to the branch metric for the branch, $\lambda k^i$, $q+r+s+t \leq i \leq q+r+s+t+u-1$, minus the a priori probability, $\lambda_i$, of the bit, the forward state probability of state m' at time k, $\alpha_k(m')$, and the backward state probability of state m" at time k+1, $\beta_{k+1}(m")$. A value may be computed for each of the v branches from state m' at time k to state m" at time k+1 by adding to the branch metric for the branch, $\gamma k^i$, $q+r+s+t+u \leq i \leq q+r+s+t+u+v-1$, minus the a priori probability, $\lambda_i$, of the bit, the forward state probability of state m' at time k, $\alpha_k(m')$, and the backward state probability of state m" at time k+1, $\beta_{k+1}(m")$.

A branch value may be computed for each of the w branches from state m" at time k to state m'" at time k+1 by adding to the branch metric for the branch, $\gamma k^i$, $q+r+s+t+u+v \leq i \leq q+r+s+t+u+v+w-1$, minus the a priori probability, $\lambda_i$, of the bit, the forward state probability of state m' at time k, $\alpha_k(m')$, and the backward state probability of state m'" at time k+1, $\beta_{k+1}(m'")$. A branch value may be computed for each of the x branches from state m' at time k to state m'" at time k+1 by adding to the branch metric for the branch, $\gamma k^i$, $q+r+s+t+u+v+w \leq i \leq q+r+s+t+u+v+w+x-1$, minus the a priori probability, $\lambda_i$, of the branch, the forward state probability of state m' at time k, $\alpha_k(m')$, and the backward state probability of state m''' at time k+1, $\beta_{k+1}(m''')$.

A first value may then be derived by performing a group operation, e.g., MAX*, on the branch values for all the branches which imply release of a logical '1', i.e., the r branches from state m to state m'', the t branches from state m to state m''', the v branches from state m' to state m'', and the x branches from state m' to state m'''. Similarly, a second value may be derived by performing a group operation, e.g., MAX*, on the branch values for all branches which imply release of a logical '0', i.e., the q branches from state m to state m'', the s branches from state m to state m''', the u branches from state m' to state m'', and the w branches from state m' to state m'''. The extrinsic output for the bit may then be formed from the difference between the first and second values.

The process of determining an estimate of the encoder input bit is simplified in this implementation example since all the branches terminating at a particular state at time k+1 are assumed to imply release of the same value for the bit. Thus, the q branches from state m to m'', the r branches from state m to m'', the u branches from state m' to state m'', and the v branches from state m' to state m'' are all assumed to imply release of a logical '0' for the bit in question. Similarly, the s branches from state m to state m''', the t branches from state m to state m''', the w branches from state m' to state m''', and the x branches from state m' to state m''' are all assumed to imply release of a logical '1' for the bit in question.

Here, the process begins by determining a state value for each of the terminating states, m'' and m''', equal to the sum of the forward and backward state probabilities for the state. Thus, the value for state m'' is set equal to $\alpha_{k+1}(m'')+\beta_{k+1}(m'')$, and that for state m''' is set equal to $\alpha_{k+1}(m''')+\beta_{k+1}(m''')$.

A first value is then derived from a group operation, e.g., MAX*, performed on all those state values which imply release of a logical '1'. In this case, only the value for state m''' meets this criterion, so the first value is set equal to $\alpha_{k+1}(m''')+\beta_{k+1}(m''')$. Similarly, a second value is then derived from a group operation, e.g., MAX*, performed on all those state values which imply release of a logical '0'. In this case, only the value for state m'' meets this criterion, so the second value is set equal to the value $\alpha_{k+1}(m'')+\beta_{k+1}(m'')$.

A third value is then derived from the difference between the first and second values, or $[\alpha_{k+1}(m''')+\beta_{k+1}(m''')]-[\alpha_{k+1}(m'')+\beta_{k+1}(m'')]$. The third value is then compared with zero. If greater than or equal to zero, the estimate is taken to be a logical '1'; if less than zero, the estimate is taken to be a logical '0'.

Figure 7B:
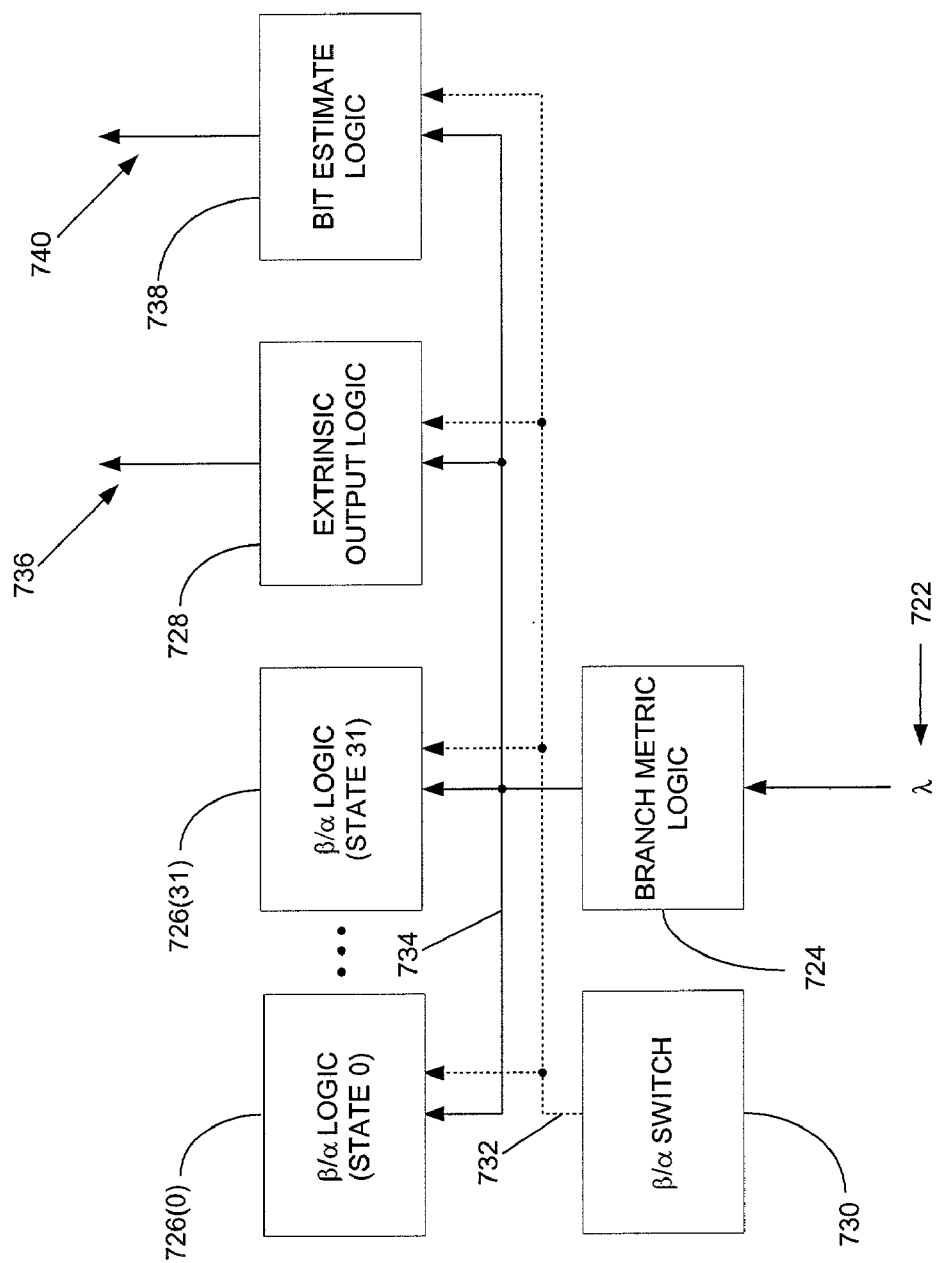
FIG. 7B is a block diagram of a second embodiment of a system for decoding trellis coded bits according to the invention.

A second embodiment of a system according to the invention is illustrated in block diagram form in FIG. 7B. The system is configured to decode coded bits output by the convolutional encoder illustrated in FIG. 4B. In this encoder, zeroes are substituted for punctured output bits in contrast to simply eliminating the punctured bit. Consequently, every input bit to the decoder will give rise to two output bits notwithstanding the presence of puncturing. This simplifies the decoding process, since it means that each branch of the trellis representation can be associated with one input bit and two output bits even with puncturing.

Referring to FIG. 7B, a priori probabilities for 2 output bits from the encoder are input to branch metric logic 724. These a priori probabilities are identified in the figure with numeral 722.

Figure 8D:
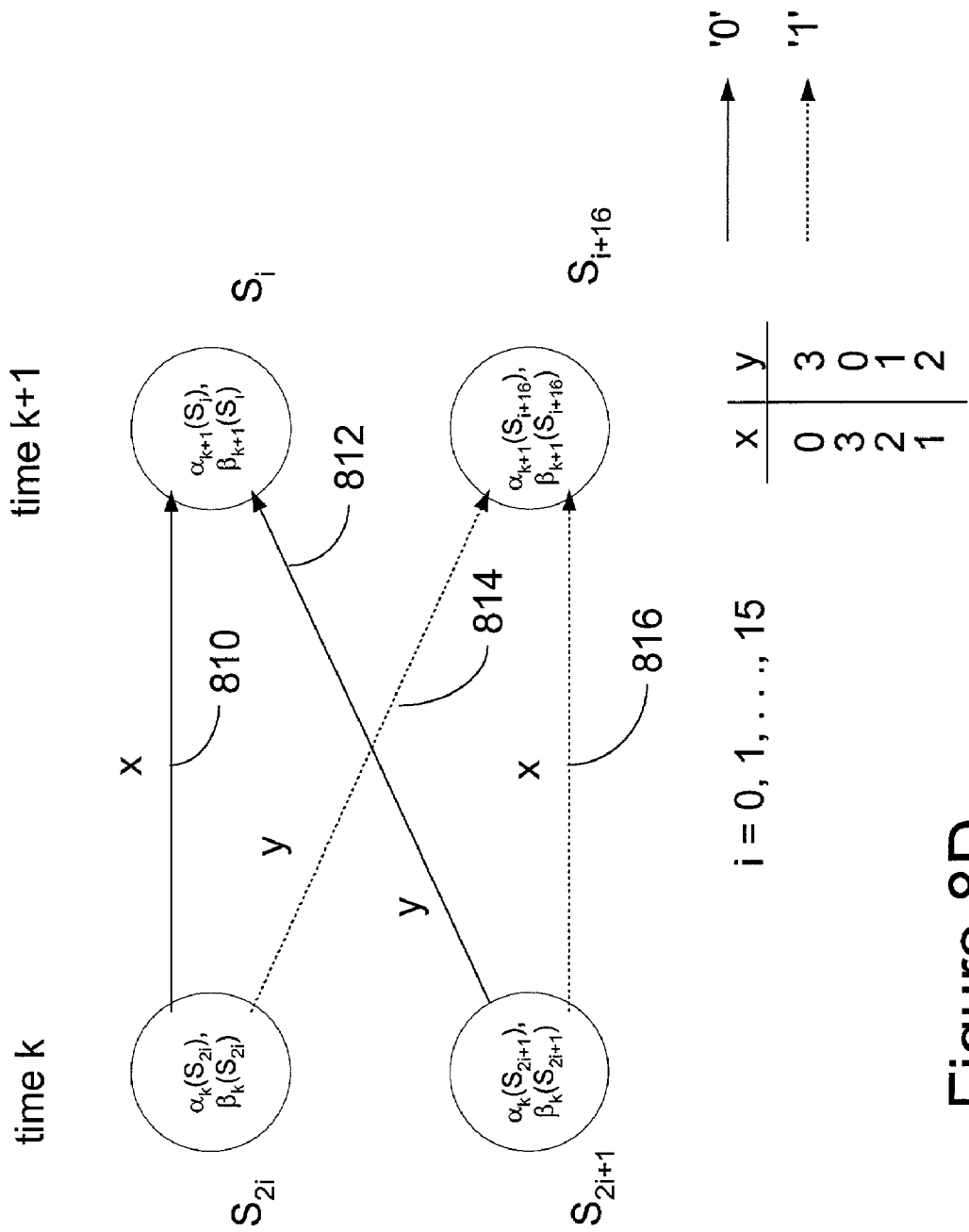
FIG. 8D is a portion of a trellis illustrating the computation of bit estimates according to one embodiment of the invention.

The branch metric logic 724 is configured to produce, in parallel, branch metrics for each of the branches in the portion of the trellis corresponding to the inputs 722. To further explain the operation of the branch metric logic 724, consider that the corresponding portion of the trellis may be represented as illustrated in FIG. 8D. At each instant of time, there are 32 states in the trellis, states 0 through 31, reflecting the fact that the constraint length of the corresponding encoder is six (one plus the number of shift registers), and the number of states in the trellis is given by two raised to the power of the constraint length minus one.

Each branch represents a transition of the encoder from one of the states at time k to one of the states at time k+1 and therefore corresponds to a particular combination of an input bit and the resulting two output bits. In the figure, the input bit corresponding to a branch is indicated by whether the branch is a solid or dashed line, with a solid line indicating a logical '0', and a dashed line indicating a logical '1'. The two output bits corresponding to a branch is indicated by the label x or y for the branch, which can take on the values 0, 1, 2, 3, corresponding respectively to logical '00', '01', '10', and '11' for the two output bits. As indicated, two branches terminate at each of the states at time k, and both of the branches imply release of the same value for the input bit, whether logical '1' or logical '0'. In addition, the output bits for the two branches which terminate at a state at time k+1, which can be represented as x and y, bear a relationship which can be expressed by the following table:

| X | Y |
|---|---|
| 0 | 3 |
| 3 | 0 |
| 2 | 1 |
| 1 | 2 |

Moreover, for states $S_1$ and $S_{i+16}$ at time k+1, where $0 \leq i \leq 15$, the two branches which terminate at these states originate respectively from state $S_{2i}$ and $S_{2i+1}$ at time k.

Turning back to FIG. 7B, the branch metric logic 724 computes in parallel the 4 branch metrics for the 4 branches illustrated in FIG. 8D. Generally speaking, the branch metric for a branch represents a measure of the correlation between the two encoder output bits corresponding to the branch with the two a priori probabilities input to the branch metric logic 724, which may be represented as $\lambda_0$ and $\lambda_1$. Given the four possible combinations of output bits, '00', '01', '10', and '11', the four branch metrics computed by branch metric logic 724 may be represented as 0, $\lambda_0$, $\lambda_1$, and $\lambda_0+\lambda_1$.

$\beta/\alpha$ switch 730 indicates whether the system is functioning as a backward engine ($\beta$ mode) or whether it is functioning as a forward engine ($\alpha$ mode).

The branch metrics produced by branch metric logic 724 are provided to $\beta/\alpha$ logic (state 0) 726(0), $\beta/\alpha$ logic (state 1) 726(1), . . . , $\beta/\alpha$ logic (state 31) 726(31), extrinsic output logic 728, and bit estimate logic 738 over one or more signal lines 734. In addition, the indication of whether the system is functioning in $\beta$ or $\alpha$ mode is provided to $\beta/\alpha$ logic (state 0) 726(0), $\beta/\alpha$ logic (state 1) 726(1), . . . , $\beta/\alpha$ logic (state 31) 726(31), extrinsic output logic 728, and bit estimate logic 738 over one or more signal lines 732.

Responsive to these inputs, $\beta/\alpha$ logic (state 0) 726(0) is configured to determine/update the backward or forward state probabilities of state 0, $\beta/\alpha$ logic (state 1) 726(1) is configured to determine/update the backward or forward state probabilities of state 1, . . . , and $\beta/\alpha$ logic (state 31)

726(31) is configured to determine/update the backward or forward state probabilities of state 31. Each of logic 726(0), logic 726(1), . . . , logic 726(31) are configured to operate in parallel.

If β mode is called for, the β/α logic for state $S_{2i}$, $0 \leq i \leq 15$, computes the backward state probability for state $S_{2i}$ at time k, $\beta_k(S_{2i})$, responsive to the backward probabilities for states $S_i$ and $S_{i+16}$ at time k+1, $\beta_{k+1}(S_i)$ and $\beta_{k+1}(S_{i+16})$, respectively, and the branch metrics for the branches between states $S_{2i}$ and $S_i$, and between $S_{2i}$ and $S_{i+16}$, which may respectively be represented as X•λ and Y•λ. In particular, the β/α logic for state $S_{2i}$ determines a value for each of the two branches equal to the sum of the branch metric for the branch and the backward state probability for the terminating state of the branch. The values for the two branches may respectively be represented as $\beta_{k+1}(S_i)+X•\lambda$ and $\beta_{k+1}(S_{i+16})+Y•\lambda$. Then it determines the backward state probability for state $S_{2i}$ at time k, $\beta_k(S_{2i})$, by taking the MAX* of the two branch values. Mathematically, this operation may be represented as follows: $\beta_k(S_{2i})=$ MAX*$[(\beta_{k+1}(S_1)+X•\lambda), (\beta_{k+1}(S_{i+16})+Y•\lambda]$.

In parallel with this, the β/α logic for state $S_{2i+1}, 0 \leq i \leq 15$, computes the backward state probability for state $S_{2i+1}$ at time k, $\beta_k(S_{2i+1})$, responsive to the backward probabilities for states $S_i$ and $S_{i+16}$ at time k+1, $\beta_{k+1}(S_1)$ and $\beta_{k+1}(S_{i+16})$, respectively, and the branch metrics for the branches between states $S_{2i+1}$ and $S_i$, and between $S_{2i+1}$ and $S_{i+16}$, which may respectively be represented as Y•λ and X•λ. In particular, the β/α logic for state $S_{2i+1}$ determines a value for each of the two branches equal to the sum of the branch metric for the branch and the backward state probability for the terminating state of the branch. The values for the two branches may respectively be represented as $\beta_{k+1}(S_i)+Y•\lambda$ and $\beta_{k+1}(S_{i+16})+X•\lambda$. Then it determines the backward state probability for state $S_{2i+1}$ at time k, $\beta_k(S_{2i+1})$, by taking the MAX* of the two branch values. Mathematically, this operation may be represented as follows: $\beta_k(S_{2i+1})=$MAX*$[(\beta_{k+1}(S_i)+Y•\lambda), (\beta_{k+1}(S_{i+16})+X•\lambda)]$.

If α mode is called for, the β/α logic for state $S_i, 0 \leq i \leq 15$, computes the forward state probability for state $S_i$ at time k+1, $\alpha_{k+1}(S_1)$, responsive to the forward probabilities for states $S_{2i}$ and $S_{2i+1}$ at time k, $\alpha_k(S_{2i})$ and $\alpha_k(S_{2i+1})$, respectively, and the branch metrics for the branches between $S_i$ and $S_{2i}$, and between $S_i$ and $S_{2i+1}$, which may respectively be represented as X•λ and Y•λ. In particular, the β/α logic for state $S_i$ determines a value for each of the two branches equal to the sum of the branch metric for the branch and the forward state probability for the originating state of the branch. The values for the two branches may respectively be represented as $\alpha_k(S_{2i})+X•\lambda$ and $\alpha_k(S_{2i+1})+Y•\lambda$. Then it determines the forward state probability for state $S_i$ at time k+1, $\alpha_{k+1}(S_i)$, by taking the MAX* of the two branch values. Mathematically, this operation may be represented as follows: $\alpha_{k+1}(S_i)=$ MAX*$[(\alpha_k(S_{2i})+X•\lambda), (\alpha_k(S_{2i+1})+Y•\lambda)]$.

In parallel with this, the β/α, logic for state $S_{i+16}$, $0 \leq i \leq 15$, computes the forward state probability for state $S_{i+16}$ at time k+1, $\alpha_{k+1}(S_{i+16})$, responsive to the forward probabilities for states $S_{2i}$ and $S_{2i+1}$ at time k, $\alpha_k(S_{2i})$ and $\alpha_k(S_{2i+1})$, respectively, and the branch metrics for the branches between the two states, which may respectively be represented as Y•λ and X•λ. In particular, the β/α logic for state $S_{i+16}$ determines a value for each of the two branches equal to the sum of the branch metric for the branch and the forward state probability for the originating state of the branch. The values for the two branches may respectively be represented as $\alpha_k(S_{2i})+Y•\lambda$ and $\alpha_k(S_{2i+1})+X•\lambda$. Then it determines the forward state probability for state $S_{i+16}$ at time k+1, $\alpha_{k+1}(S_{i+16})$, by taking the MAX* of the two branch values. Mathematically, this operation may be represented as follows: $\alpha_{k+1}(S_{i+16})=$ MAX*$[(\alpha_k(S_{2i})+Y•\lambda), (\alpha_k(S_{2i+1})+X•\lambda)]$.

Extrinsic output logic 728 determines extrinsic outputs for each of the two encoder output bits. In one embodiment, extrinsic output logic 728 is only enabled if the α mode is called for, i.e., if the system is functioning as a forward engine. In this embodiment, one or more backward engines compute backward state probabilities for a portion of a trellis, and then one or more forward engines compute forward state probabilities and concurrently generate extrinsic outputs in parallel with the calculation of forward state probabilities. However, it should be appreciated that other embodiments are possible, including embodiments where extrinsic outputs are generated by one or more forward engines in parallel with the calculation of backward state probabilities.

With reference to FIG. 8D, in one embodiment, extrinsic output logic 728 produces extrinsic outputs after the forward state probabilities for all 32 states at time k have been produced, the backward state probabilities for all 32 states at time k+1 have been produced, and the four possible branch metrics for the 64 branches between the states in the two time periods have been produced.

This process of determining the extrinsic outputs may occur through 2 iterations, one for each of the 2 output bits. In a particular iteration, the process begins by determining branch values for each of the 64 branches equal to the sum of the forward state probability for the originating state of the branch, minus the a priori probability, $\lambda_1$ for the bit, the branch metric for the branch, and the backward state probability for the terminating state for the branch. Then, a first value is derived from the MAX* of the branch values of the 32 branches which imply release of a logical '1', and a second value is derived from the MAX* of the branch values of the 32 branches which imply release of a logical '0'. The extrinsic output of the bit is then derived from the difference between the first and second values. This process is then repeated for the other output bit.

Bit estimate logic 738 determines an estimate of the input bit which corresponds to the two encoder output bits. In one embodiment, bit estimate logic 728 is only enabled if the α mode is called for, i.e., if the system is functioning as a forward engine. In this embodiment, one or more backward engines compute backward state probabilities for a portion of a trellis, and then one or more forward engines compute forward state probabilities and concurrently generate bit estimates in parallel with the calculation of forward state probabilities. However, it should be appreciated that other embodiments are possible, including embodiments where bit estimates are generated by one or more forward engines in parallel with the calculation of backward state probabilities.

With reference to FIG. 8D, in one embodiment, bit estimate logic 728 produces the bit estimate after the forward state probabilities for all 32 states at time k have been produced, the backward state probabilities for all 32 states at time k+1 have been produced, and the four possible branch metrics for the 64 branches between the states in the two time periods have been produced.

In one embodiment, this process of determining the bit estimates is simplified compared to the process of determining extrinsic outputs because all the branches terminating at a state imply release of the same input bit, whether logical '1'or logical '0'. Thus, referring to FIG. 8D, all the branches which terminate at state $S_i$, $0 \leq i \leq 15$, imply release of a logical '0', and all the branches which terminate at state $S_{i+16}$, $0 \leq i \leq 15$, imply release of a logical '1'. Because of this characteristic, in one embodiment, it is unnecessary to determine branch values for each of the 64 branches as occurred during the computation of extrinsic outputs. Instead, in this embodiment, only state values for each of the 32 states at time k+1 need be computed, equal to the sum of the forward and backward state probabilities for the state at time k+1.

Then, a first value may be derived from the MAX* of all the values for the states which imply release of a logical '1'. Referring to FIG. 8D, this will be the last 16 states, $S_{i+16}$, $0 \leq i \leq 15$. In addition, a second value may be derived from the MAX* of all the values for the states which imply release of a logical '0'. Referring to FIG. 8D, this will be the first 16 states, $S_i$, $0 \leq i \leq 15$. Then, a third value may be derived from the first and second values and compared to a threshold. If it equals or exceeds the threshold, the estimate of the bit is determined to be a logical '1', and if it is less than the threshold, the estimate of the bit is determined to be a logical '0'.

Figure 9:
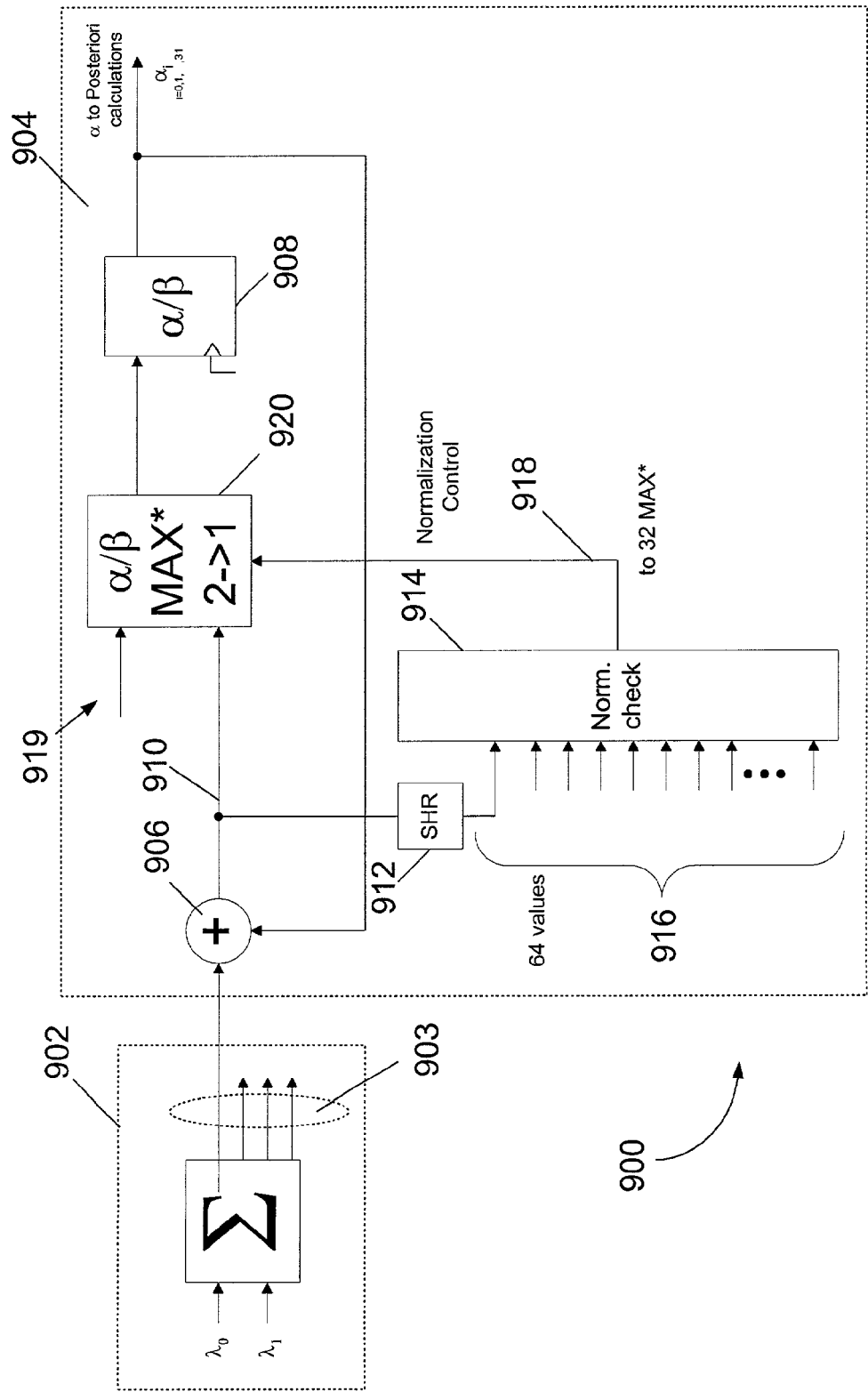
FIG. 9 is a block diagram illustrating one implementation of branch metric logic and state probability logic according to the invention.

An implementation of the embodiment of FIG. 7B will now be described. This implementation may be configured as a forward engine or a backward engine. Referring to FIG. 9, the implementation comprises branch metric logic 902, and 32 instances of state probability logic 904, one for each of the 32 states in the trellis. In addition, the implementation comprises bit estimate logic 1200, illustrated in FIG. 12, and extrinsic output logic 1300, illustrated in FIG. 13. These components will now be described in more detail.

Figure 10:
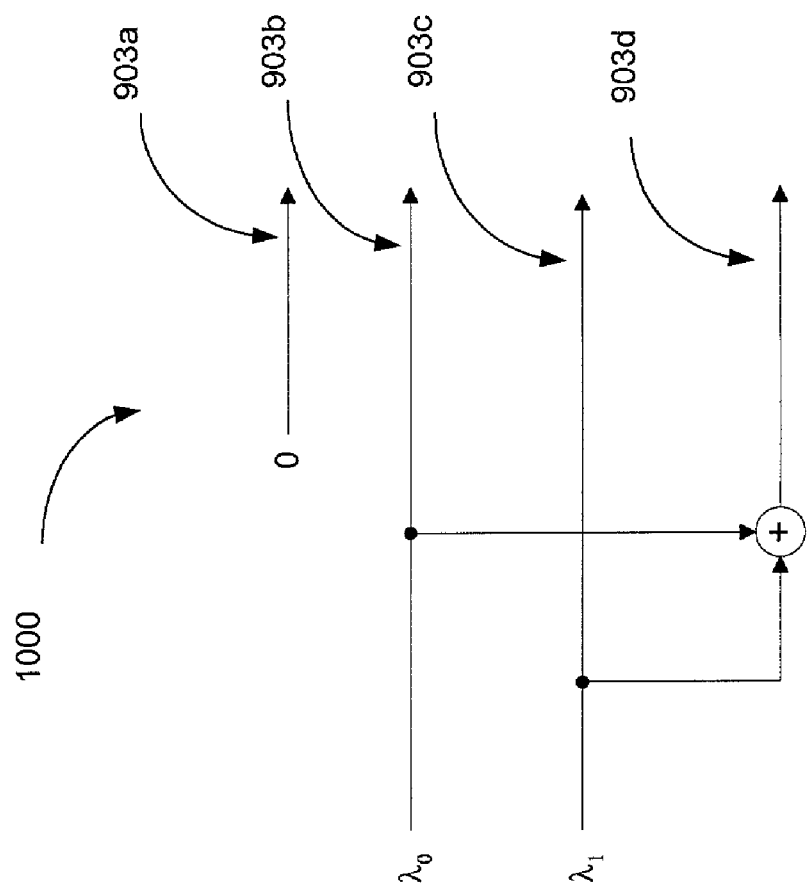
FIG. 10 is a block diagram illustrating one implementation of branch metric logic according to the invention.

Referring to FIG. 9, branch metric logic 902 receives as inputs a priori probabilities, $\lambda_0$ and $\lambda_1$, for each of two encoder output bits, and determines the four possible branch metrics which may result from these two a prior probabilities, 0, $\lambda_0$, $\lambda_1$, and $\lambda_0+\lambda_1$. These values are output on the four signal lines identified with numeral 903. Referring to FIG. 10, additional detail about the branch metric logic 902 is illustrated. As can be seen, the value 0 is output on signal line 903a; the value $\lambda_0$ is output on signal line 903b; the value $\lambda_1$ is output on signal line 903c; and the value $\lambda_0+\lambda_1$ output on signal line 903d. One of these four values is assigned to each of the 64 branches which exist between the 32 states in a first portion of the trellis and the 32 states in a second portion of the trellis.

Referring back to FIG. 9, the branch metrics are input to state probability logic 904. (In this implementation, there will be 32 instances of probability logic 904, one for each of the states. However, for sake of simplicity and ease of illustration, only one of these instances is illustrated in FIG. 9.) There, if the implementation is functioning as a forward engine, the branch metric for one of the branches entering the state is added by adder 906 to the forward state probability for the originating state of the branch, which is provided by storage logic 908, and the sum output on signal line 910. This value is then input to MAX* 2→1 logic 920 along with the corresponding value computed for the other branch entering the state. (As shown in FIG. 8D, in one implementation, there are 2 branches entering each state, and the sum of the forward state probability and branch metric for each of the two branches must be determined. The logic to compute this other value is not shown in FIG. 9, but it is a mirror image of the logic used to compute the value output on signal line 910; this other value is input to MAX* 2-→1 logic 920 at input 919.).

Conversely, if the implementation is functioning as a backward engine, the branch metric for one of the branches exiting the state is added by adder 906 to the backward state probability for the terminating state of the branch, which is provided by storage logic 908, and the sum output on signal line 910. This value is then input to MAX* 2→1 logic 920 along with the corresponding value computed for the other branch exiting the state. (As shown in FIG. 8D, in one implementation, there are two values exiting each state, and the sum of the backward state probability and branch metric for each of the two branches must be determined. The logic to compute this other value is not shown in FIG. 9, but it is a mirror image of the logic used to compute the value output on signal line 910; this other value is input to MAX* 2->1 logic 920 at input 919.).

MAX* 2→1 logic 920 determines the MAX* of the two values provided at its inputs, and the output becomes the state probability of the originating state of the two branches if the implementation is functioning as a backward engine, or it becomes the state probability of the terminating state of the two branches if the implementation is functioning as a forward engine. In any event, this state probability is stored in a corresponding location of storage logic 908. Note that in the case in which the implementation computes exitrinsic outputs/bit estimates "on the fly" along with the computation of forward state probabilities, there is no need to store other than the most recent state probabilitiy for the state. In this event, and the implementation is functioning as a forward engine, the state probability computed by MAX* 2→1 logic 920 overwrites the previously computed state probability. However, if the implementation is functioning as a backward engine, there is a need to store the backward state probability until the corresponding extrinsic outputs/bit estimates can be computed. In this event, storage logic 908 provides for storage of a block of backward state probabilties. (In one implementation, storage logic 908 is a RAM known as the β-RAM.) In this event, the state probability computed by MAX* 2→1 logic 920 does not overwrite the previously computed state probabilitiy, but is retained along with the previously computed state probabilitiy in storage.

MAX*2→1 logic 920 is configured to concurrently normalize the state probabilities as it computes them responsive to assertion of a normalization control signal 918 output by normalization logic 914. To determine if normalization is required, normalization logic 914 evaluates the most significant bits of the (originating/terminating state probability and branch metric) sums for each of the 64 branches which are present in the corresponding portion of the trellis. These sums include the values provided on signal lines 910 and 919 along with the values for the other 62 branches which are determined at the same time. In one embodiment, these values are shifted right by one or more shifters to isolate the most significant bits. Thus, the value output on signal line 910 is shifted right by shifter 912 to isolate the most significant bits of this value. A similar operation is performed for the other 63 values. The resulting values (64 in all) are input to normalization logic 914 which determines if any one of the resulting values exceeds a predetermined threshold. If so, the normalization control signal 918 is asserted to indicate that the 32 state probabilties which are being computed at the time should be normalized.

Figure 11A:
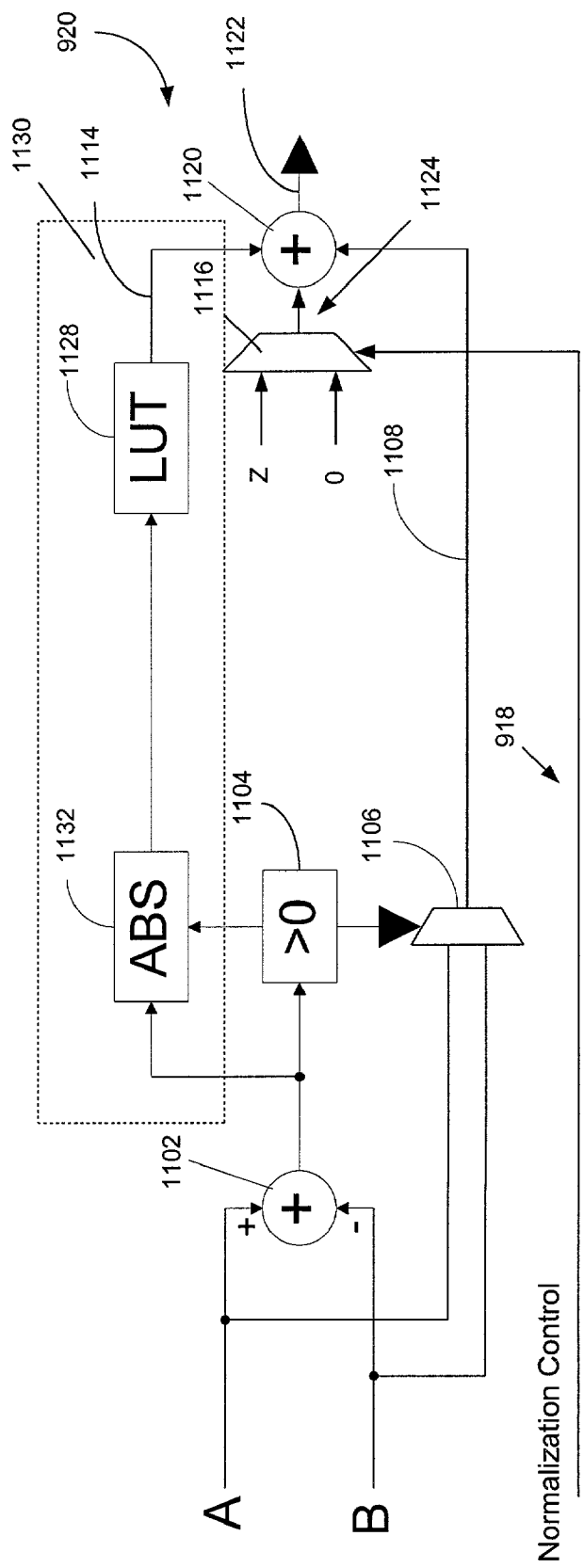
FIG. 11A illustrates one embodiment of logic for simultaneously performing MAX* and normalization operations.

FIG. 11A illustrates one embodiment of MAX* 2->1 logic 920 of FIG. 9. As illustrated, logic 1102 receives the two operands, A and B, forms the difference, A–B, between the two, and outputs a signal representative of this difference value. Logic 1104 receives the signal representing this difference value, tests whether it is greater than zero, and then outputs a signal indicative of the results of this test. Logic 1106 receives this signal, and the two operands A and B, and outputs the operand A if the signal from logic 1104 indicates that the difference value A–B is greater than zero;

if this signal indicates that the difference value A−B is less than or equal to zero, it outputs the operand B. Thus, it can be seen that the output of logic 1106 is a signal representative of the maximum of A and B, or MAX(A, B).

Logic 1132 receives from logic 1102 the signal representative of the difference value A−B, and from logic 1104 the signal indicative of whether the difference value A−B is greater than zero, and outputs a signal representative of the value A−B if the signal from logic 1104 indicates that the difference value A−B is greater than zero; if the signal from logic 1104 indicates that the difference value A−B is less than or equal to zero, logic 1132 outputs a signal representative of the value−(A−B). Thus, it can be seen that the output of logic 1132 is a signal representative of the absolute value of A−B or ABS(A−B).

Logic 1128 receives the signal from logic 1132 (which is representative of ABS(A−B)) and accesses a lookup table (LUT) using the value ABS(A−B) as the argument. (Together, logic 1128 and 1132 form logic 1130). The LUT associates a value corresponding to ln(1+exp(−|A−B|)) with the value ABS(A−B) for representative ones of the value ABS(A−B). Thus, it can be seen that logic 1128 retrieves a value corresponding to ln(1+exp(−|A−B|)) based on the argument ABS(A−B). Logic 1128 outputs a signal representative of or corresponding to the value ln(1+exp(−|A−B|)).

Logic 1116 outputs a predetermined negative number Z on signal line 1124 if the normalization control signal 918 is asserted; otherwise, it outputs the value 0 on signal line 1124. Logic 1120 adds the value output on signal line 1124 to the values output on signal lines 1114 and 1108 to produce the output 1122 of the MAX* 2->1 logic 920. The effect is to normalize the output of the MAX* 2→1 logic using the predetermined negative number Z if the normalization control signal 918 is asserted. If normalization control signal 918 is not asserted, the output 1122 is a signal representative of the value MAX(A,B)+ln(1+exp(−|A−B|)). If normalization control signal 918 is asserted, the output 1122 is this value added to the constant Z.

In one example, the constant Z is $-2^5$, but it should be appreciated that many other examples are possible, so this example should not be taken as limiting.

Figure 11B:
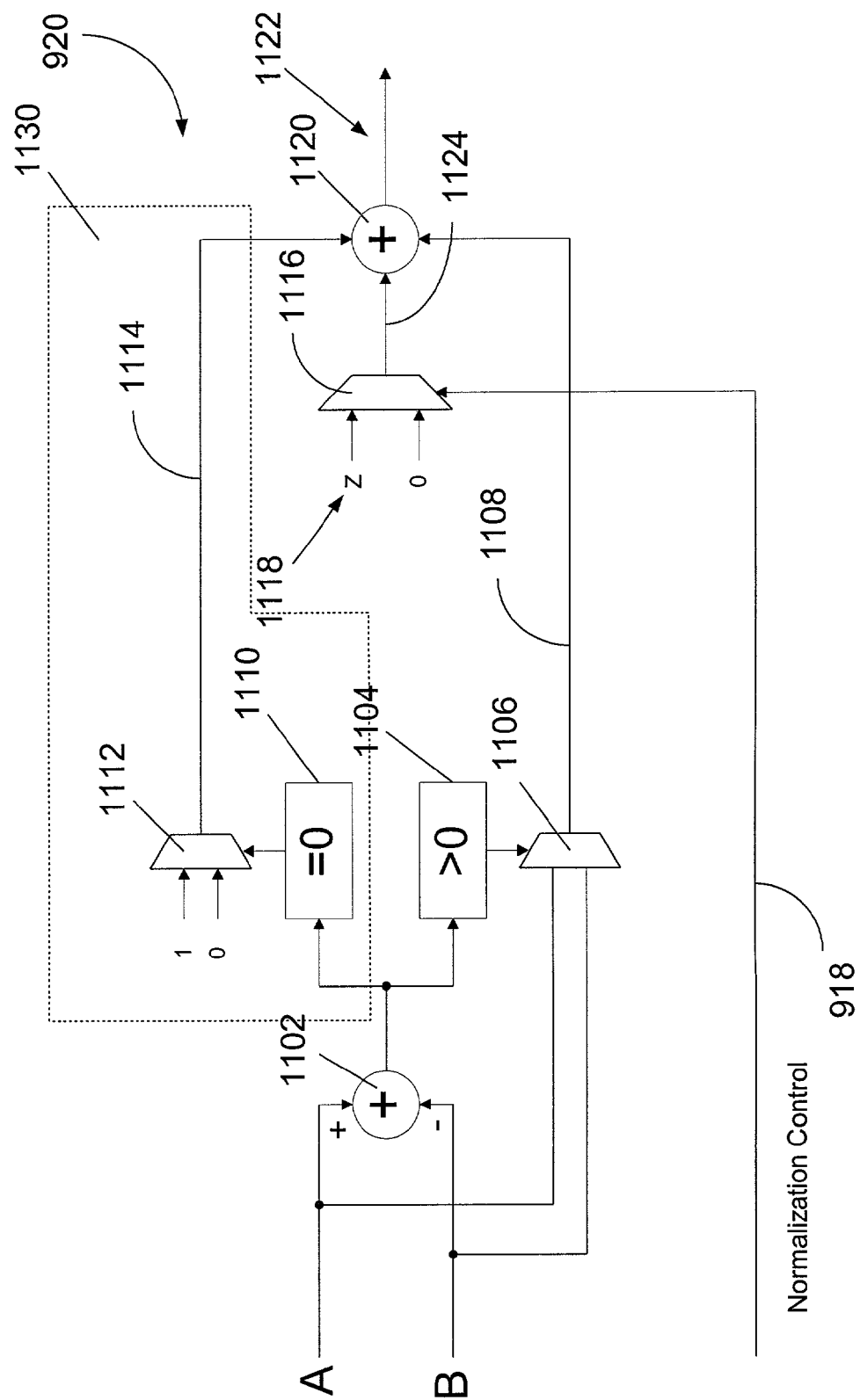
FIG. 11B is a block diagram illustrating one implementation of logic for simultaneously performing MAX* and normalization operations.

FIG. 11B is a block diagram of one implementation of the MAX* 2→1 logic 920 of FIG. 9 in which, compared to FIG. 11A, like elements are referenced with like identifying numerals. This implementation is identical to the embodiment of FIG. 11A except logic 1130 is modified to, in effect, implment a lookup table with only two options, 0 and 1. Note that many other implementations are possible, so this particular implementation should not be taken as limiting.

As illustrated, this implementation receives as inputs two operands, which are identified in FIG. 11B as A and B. Logic 1102 determines the difference, A−B, between the two, and logic 1104 tests this difference to determine if it is greater than 0. If so, logic 1106 outputs the value A on signal line 1108; otherwise, it outputs the value B on signal line 1108. Thus, the value on signal line 1108 represents the value MAX(A, B).

Logic 1110 tests whether the difference A−B is equal to 0. If so, logic 1112 outputs on signal line 1114 the value 1; otherwise, it outputs the value 0 on signal line 1114. In effect, this logic performs a lookup table operation to a lookup table which has only two entries and performs a calculation which corresponds to ln((1+exp(−|A−B|)). Instead of performing this calculation exactly, however, the logic does so by approximating the value ln(2) (the value which results when |A−B| is 0) with the value 1, and approximating ln(x), where 1≦x≦2 (the value which results when |A −B| is greater than 0), with the value 0.

Logic 1116 outputs a predetermined negative number Z on signal line 1124 if the normalization control signal 918 is asserted; otherwise, it outputs the value 0 on signal line 1124. The value output on signal line 1124 is added to the values output on signal lines 1114 and 1108. The effect is to normalize the output of the MAX* 2→1 logic using the predetermined negative number Z if the normalization control signal 918 is asserted.

Logic 1120 adds the values on signal lines 1114, 1124, and 1108 to produce the output of the MAX* 2→1 logic 920.

Again, in one example, the constant Z is $-2^5$, but it should be appreciated that many other examples are possible, so this example should not be taken as limiting.

Figure 12:
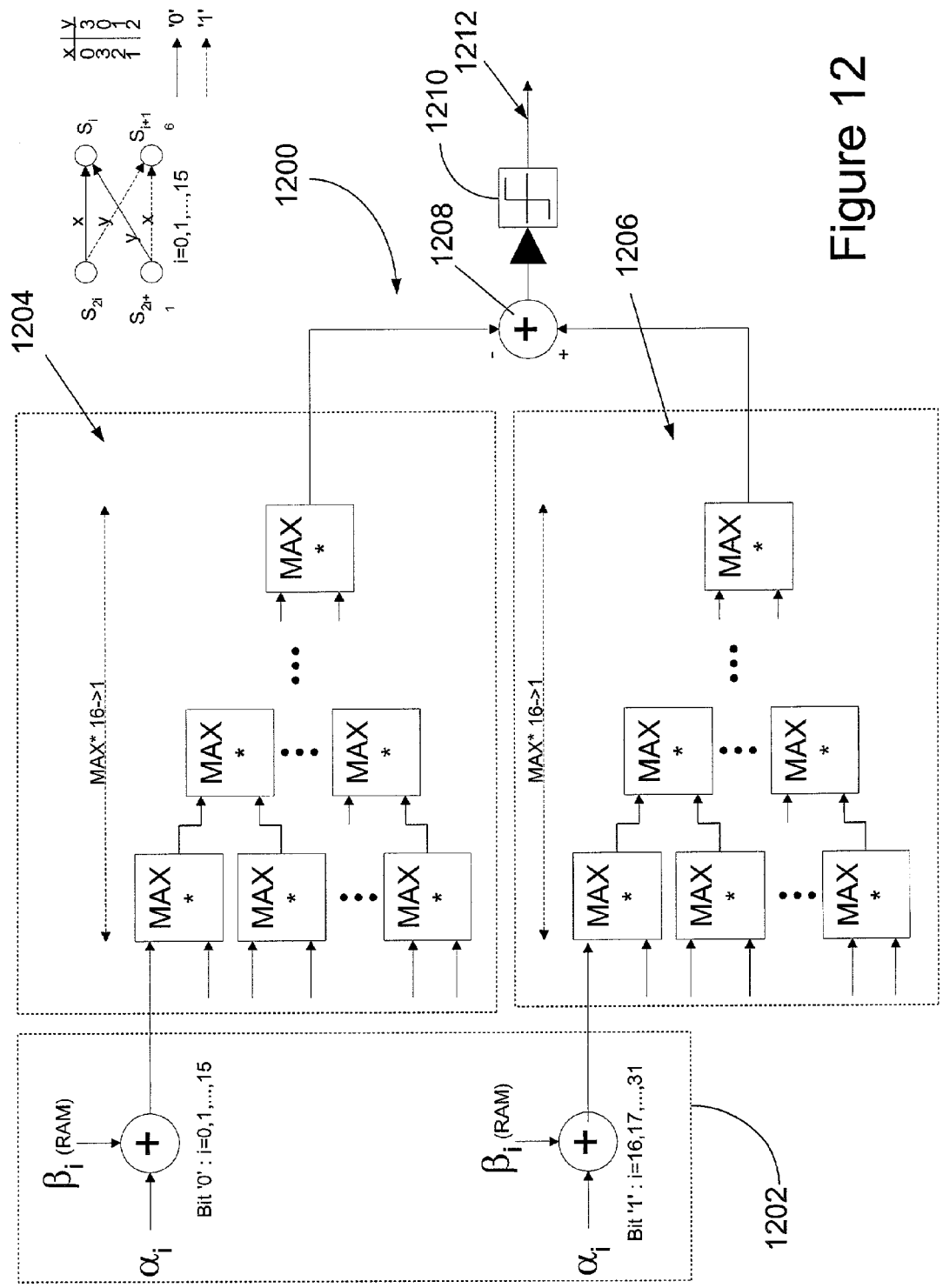
FIG. 12 is a block diagram illustrating one implementation of bit estimation logic according to the invention.

FIG. 12 illustrates bit estimate logic 1200. In one implementation, this logic estimates the input bit corresponding to a particular portion of the trellis. (Again, in one implementation, since rate 1/2 encoders are assumed, there is a single input bit corresponding to a particular portion of the trellis). As illustrated, logic 1202 computes state values for each of the 32 states in the corresponding portion of the trellis. In particular, for each of the 32 states, the logic 1202 determines the sum of the forward and backward state probabilities for the state. Logic 1204 then determines the MAX* of the resulting state values for the first 16 states in the trellis, while logic 1206 determines the MAX* of the resulting state values for the next 16 states in the trellis. Logic 1208 determines the difference between the value output from logic 1206 and that from logic 1204, and logic 1210 compares the output of logic 1208 with a threshold. If the output of logic 1208 is greater than or equal to the threshold 0, logic 1210 outputs a bit estimate which is a logical '1'; if the output of logic 1208 is less than the threshold 0, logic 1201 outputs a bit estimate which is a logical '0'.

The output of logic 1204 represents the MAX* of the branch values (where a branch value for a branch is the sum of the forward state probability of the originating state of the branch, the branch metric for the branch, and the backward state probabilitiy of the terminating state of the branch) for all 32 branches in the trellis at a particular time which imploy release of a logical '0', while the output of logic 1206 represents the MAX* of the 32 branch values for all branches in the trellis at a particular time which imply release of a logical '1'.

Because of the associative property of the MAX* operator (which means that the MAX* of the 32 branch values for all branches entering a state is equal to the forward state probabilitiy of that state) and because of the code structure (which results in all branches entering the first 16 state of the trellis implying release of a logical '0' and all branches entering the last 16 states of the trellis implying release of a logical '1'), these computations are simplified in the manner illustrated. In particular, the output of logic 1206 in one implementation is computed by taking the MAX* of state values for the last 16 states in the trellis, while the output of logic 1204 in this implementation is computed by taking the MAX* of state values for the first 16 states in the trellis.

Figure 13:
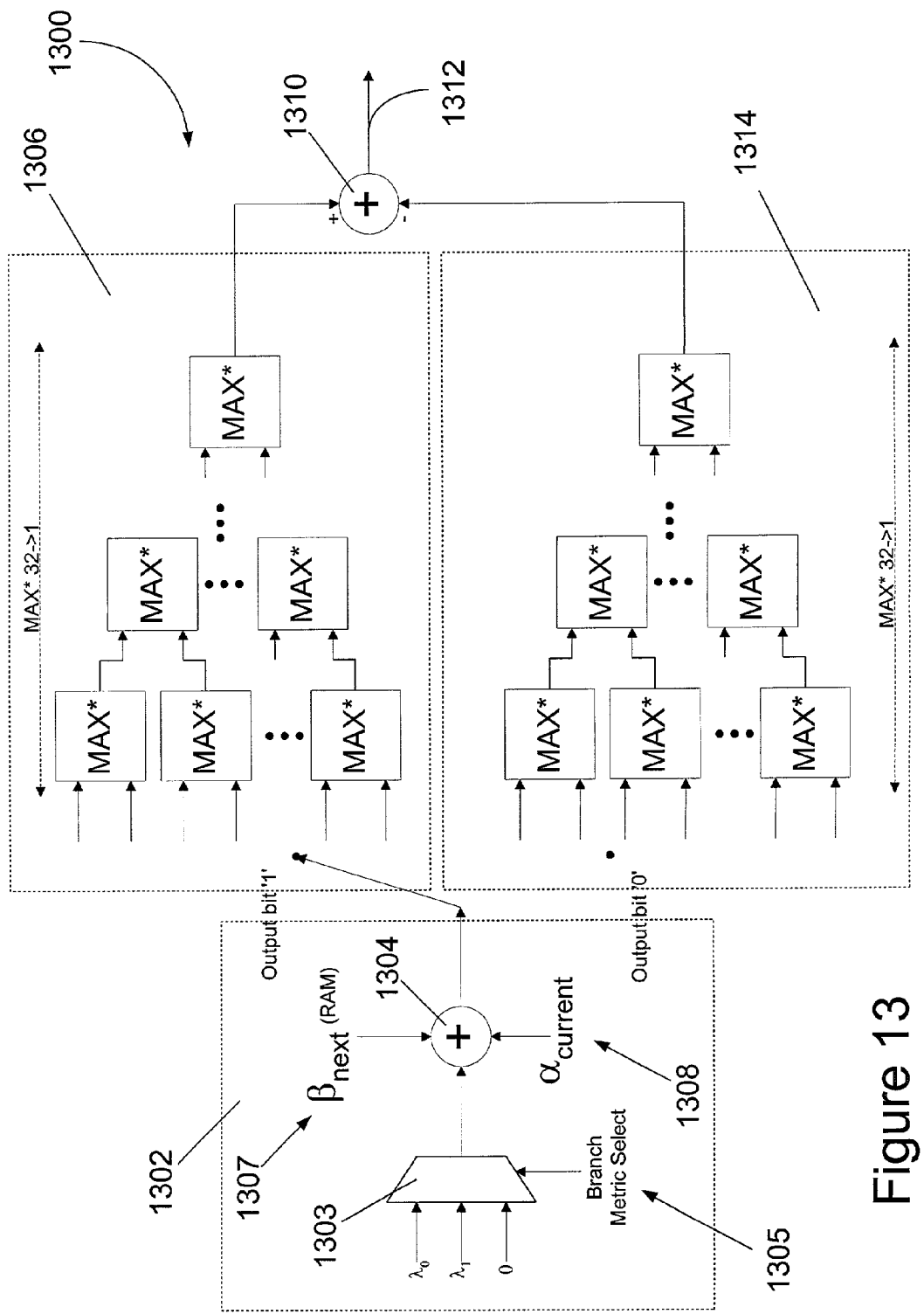
FIG. 13 is a block diagram illustrating one implementation of extrinsic output logic according to the invention.

FIG. 13 illustrates the extrinsic output logic 1300. In one implementation, this logic iteratively computes extrinsic outputs for each of two bits corresponding to a particular portion of the trellis. (In one implementation, there will be 2 output bits corresponding to a particular portion of the trellis since a rate 1/2 encoder is assumed). As illustrated, logic 1302 computes for each of the 64 branches in the particular portion of the trellis, a branch value for each branch equal to the sum of the forward state probabilitiy of the originating state of the branch, the branch metric for the branch minus the a priori probability for the bit, and the backward state probability for the terminating state of the branch. Within logic 1302, logic 1303 selects a branch metric/a priori probability difference value for a branch from the three possible values 0, $\lambda_0$, and $\lambda_1$ responsive to a select signal 1305 for the branch. Here, there are only three possible branch metric/a priori probability difference values even though there are four possible values of the branch metric since, in computing extrinsic information for a certain bit, the input information related to that bit is not included. For example, if the branch metric for the branch is $\lambda_0+\lambda_1$, and it is desired to compute the exstrinsic information for the first bit, the value $\lambda_0$ is subtracted, resulting in $\lambda_1$. Taking all the possible options into consideration leaves only three possible values for the branch metric/a priori probability difference value.

Numeral 1308 represents the forward state probability for the originating state of the branch whose branch value is being computed. In the case that extrinsic outputs are computed "on the fly" along with the calculation of the forward state probabilities, the forward state probability is the current forward state probability value stored in storage logic 908. Numeral 1307 represents the backward state probability for the terminating state of the branch whose branch value is being computed. This backward state probability is normally stored in block form in storage logic 908 (which may be implemented as a RAM (or β-RAM)) in the case extrinsic outputs are computed "on the fly" alongside the computation of the forward state probabilities.

Logic 1304 outputs the sum of the branch metric/a priori probability difference value from logic 1303, the backward state probability for the terminating state, identified with numeral 1307, and the forward state probability of the originating state, identified with numeral 1308. It does so for each of the 64 branches in the corresponding portion of the trellis.

Logic 1306 then computes the MAX* of the values for all 32 branches which imply release of a logical '1' for the extrisinc output in question (there are two) and logic 1308 computes the MAX* of the values for all 32 branches which imply release of a logical '0' for the bit in quesiton.

Logic 1310 takes the difference between the value output by logic 1306 and logic 1308 and outputs the same on signal line 1312. This value represents an extrinsic output for the bit in question. The foregoing process is then repeated for the other output bit in question.

Figure 14:
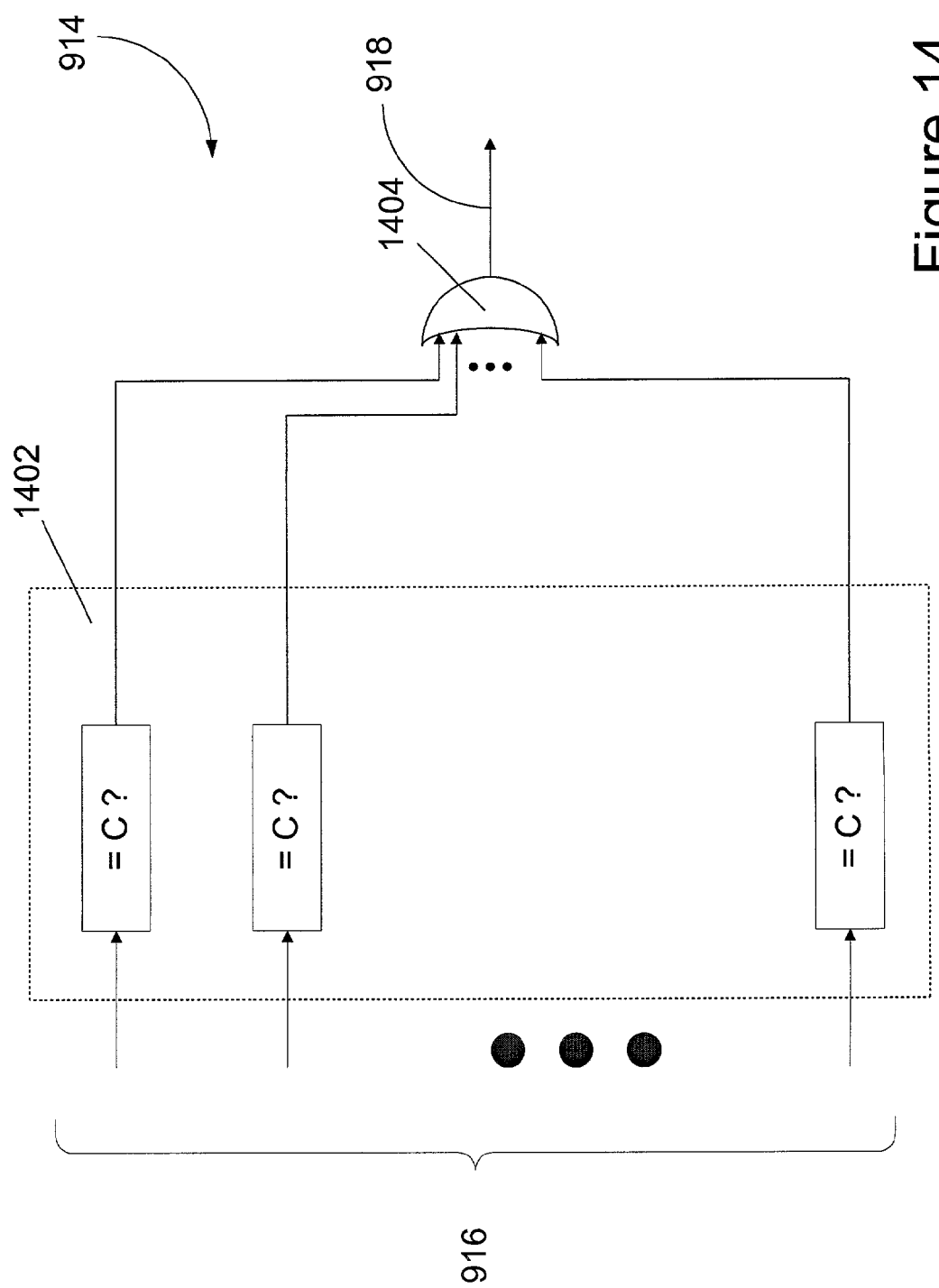
FIG. 14 is a block diagram illustrating one implementation of logic for determining a normalization control signal.

FIG. 14 illustrates normalization logic 914. As illustrated, in this particular implementation, logic 1402 receives as inputs a selected number of bits of the 64 branch values determined during the computation of state probabilities by the 32 renderings of logic 904, which values include the values provided on signal lines 910 and 919 in the logic particular rendering of logic 904 illustrated in FIG. 9, and determines if any of them equal a constant C (indicating, in one implementation, a near overflow situtation). If so, the normalization control signal which forms the output of the OR gate 1404 on signal line 918 is asserted; if not, the normalization control signal 918 remains unasserted. In one implementation example, the selected number of bits comprises the two most significant bits of each of the 64 values, and the constant C is "01", but it should be appreciated that other examples are possible, so this example should not be taken as limiting.

Figure 15A:
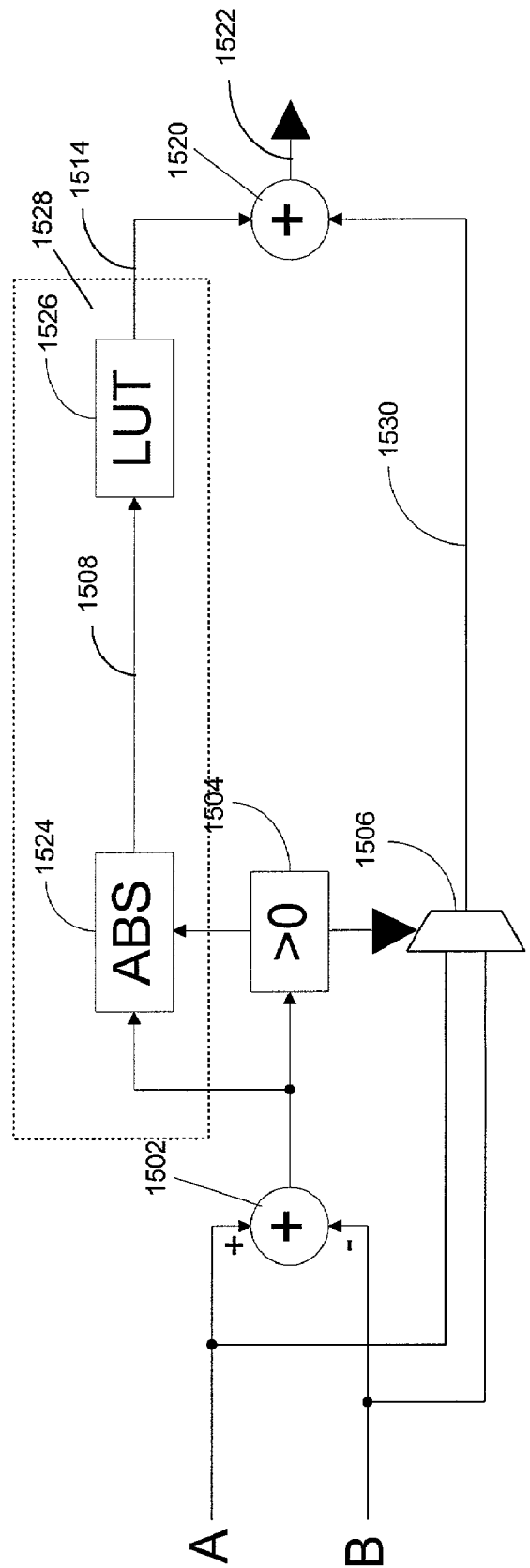
FIG. 15A illustrates one embodiment of logic for performing the MAX* operation.

FIG. 15A illustrates one embodiment of MAX* 2→1 logic which forms the basis of logic 1204 and 1206 in FIG. 12, and logic 1306 and 1308 in FIG. 13. As illustrated, logic 1502 receives the two operands, A and B, forms the difference, A−B, between the two, and outputs a signal representative of this difference value. Logic 1504 receives the signal representing this difference value, tests whether it is greater than zero, and then outputs a signal indicative of the results of this test. Logic 1506 receives this signal, and the two operands A and B, and outputs on signal line 530 the operand A if the signal from logic 1504 indicates that the difference value A−B is greater than zero; if this signal indicates that the difference value A−B is less than or equal to zero, it outputs on signal line 1530 the operand B. Thus, it can be seen that the output of logic 1506 is a signal representative of the maximum of A and B, or MAX(A, B).

Logic 1524 receives from logic 1502 the signal representative of the difference value A−B, and from logic 1504 the signal indicative of whether the difference value A−B is greater than zero, and outputs on signal line 1508 a signal representative of the value A−B if the signal from logic 1504 indicates that the difference value A−B is greater than zero; if the signal from logic 1504 indicates that the difference value A−B is less than or equal to zero, logic 1524 outputs on signal line 1508 a signal representative of the value−(A−B). Thus, it can be seen that the output of logic 1524 is a signal representative of the absolute value of A−B or ABS(A−B).

Logic 1526 receives the signal from logic 1524 (which is representative of ABS(A−B)) and accesses a lookup table (LUT) using the value ABS(A−B) as the argument. (Together, logic 1524 and 1526 form logic 1528). The LUT associates a value corresponding to $\ln(1+\exp(-|A-B|))$ with the value ABS(A−B) for representative ones of the value ABS(A−B). Thus, it can be seen that logic 1526 retrieves a value corresponding to $\ln(1+\exp(-|A-B|))$ based on the argument ABS(A−B). Logic 1526 outputs on signal line 1514 a signal representative of or corresponding to the value $\ln(1+\exp(-|A-B|))$.

Logic 1520 adds the values output on signal lines 1530 and 1514 to produce the output 1522 of the MAX* 2→1 logic. The output 1522 is a signal representative of the value MAX(A, B)+$\ln(1+\exp(-|A-B|))$.

Figure 15B:
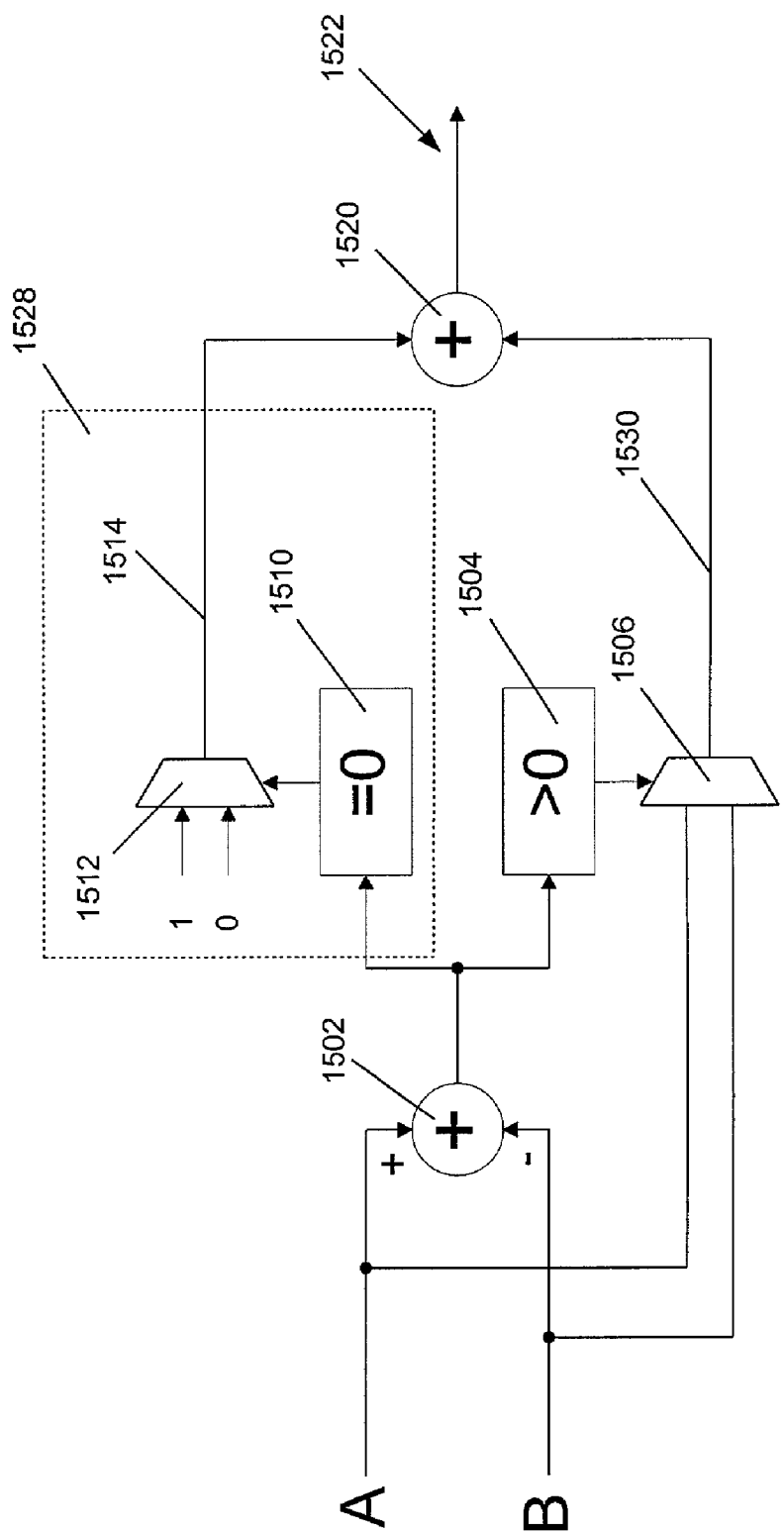
FIG. 15B is a block diagram illustrating one implementation of logic for performing the MAX* operation.

FIG. 15B is a block diagram of one implementation of the MAX* 2→1 logic in which, compared to the embodiment of FIG. 15A, like elements are referenced with like identifying numerals. This implementation is identical to the embodiment of FIG. 15A, except that logic 1528 is modified to implement in effect a lookup table with only two options, 0 and 1. It should be appreciated that many other implementations are possible, so this particular implementation should not be construed as limiting.

As illustrated, this MAX* logic receives as inputs two operands, which are identified in FIG. 15B as A and B. Logic 1502 determines the difference, A−B, between the two, and logic 1504 tests this difference to determine if it is greater than 0. If so, logic 1506 outputs the value A on signal line 1530; otherwise, it outputs the value B on signal line 1508. Thus, the value on signal line 1530 represents the value MAX(A, B).

Logic 1510 tests whether the difference A−B is equal to 0. If so, logic 1512 outputs on signal line 1514 the value 1; otherwise, it outputs the value 0 on signal line 1514. In effect, this logic performs a lookup table operation to a lookup table which has only two entries and performs a calculation which corresponds to $\ln((1+\exp(-|A-B|))$. Instead of performing this calculation exactly, however, the logic does so by approximating the value ln(2) (the value which results when |A−B | is 0) with the value 1, and approximating ln(x), where $1 \leq x \leq 2$ (the value which results when |A−B| is greater than 0), with the value 0.

Logic 1520 adds the values on signal lines 1514 and 1530 to produce the output of the MAX* 2→1 logic on signal line 1522.

For purposes of this disclosure, any of the logic referred to above can be implemented in hardware, software, or a combination of hardware and software. For example, the logic may be implemented in hardware as an asynchronous integrated circuit chip (ASIC), or a DSP or other processor configured to execute a series of instructions embodying a method according to the invention.

Figure 16:
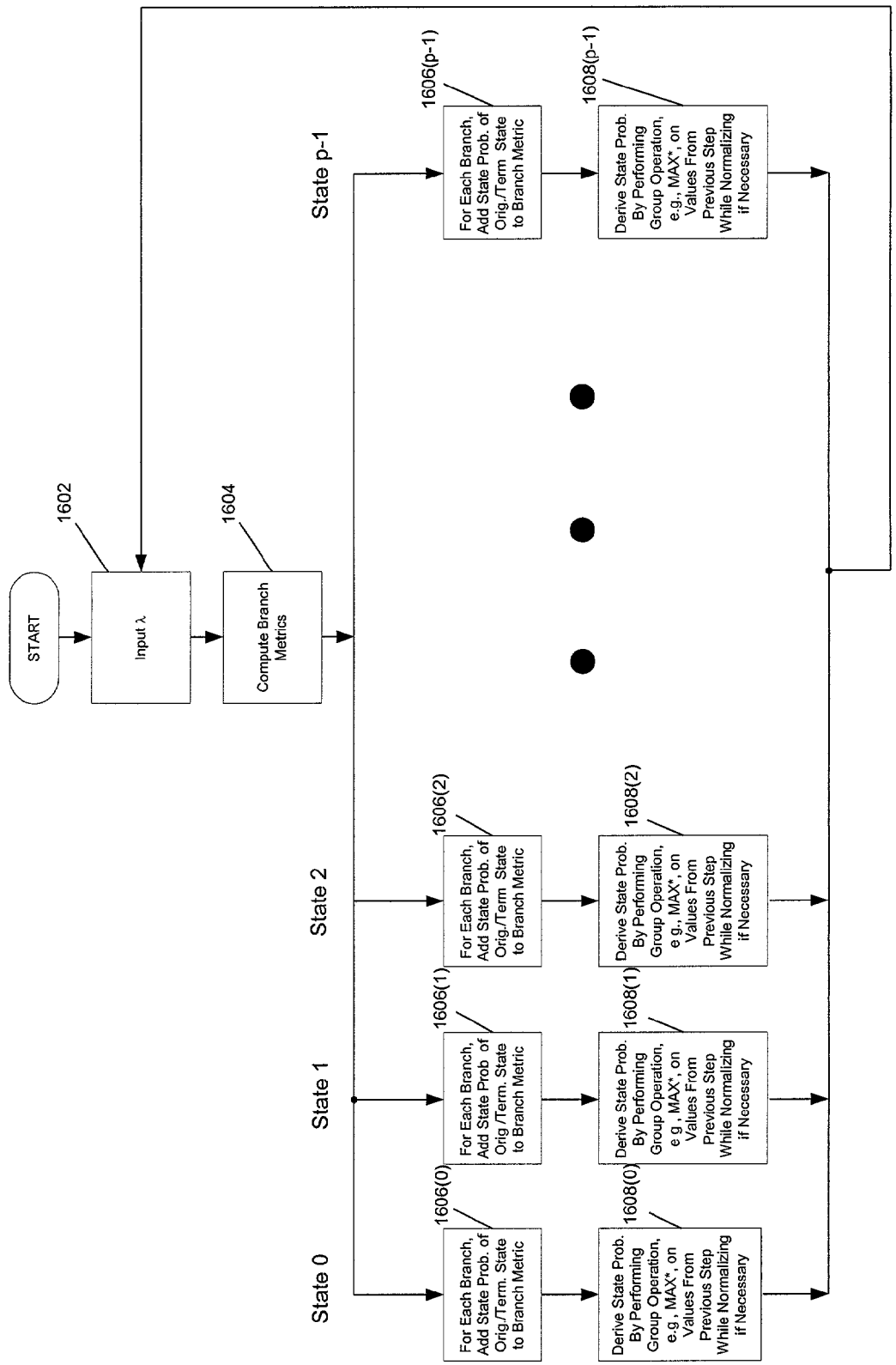
FIG. 16 is a flowchart of one embodiment of a method of determining state probabilities according to the invention.

FIG. 16 is a flowchart of one embodiment of a method for determining state probabilities according to the invention. As illustrated, the method begins with step 1602, where s a priori probabilities $\lambda_i$, $0 \leq i \leq s-1$, are input. Step 1602 is followed by state 1604, where the branch metrics are computed for the branches between first and second portions of a trellis responsive to the s a priori probabilities input in step 1602. In one implementation, these branch metrics are computed by determining all possible correlations between the s a priori probabilities and the s bits associated with each branch (in the case of two outputs, there will be 4 possibilities), and selecting for a particular branch a branch metric equal to the correlation between the s a priori probabilities and the particular s output bits associated with the branch.

After step 1604, the method branches into p different branches, where p is the number of states in the trellis, which are all performed in parallel. Thus, for a trellis with 32 states, there will be 32 branches.

As indicated by steps 1606(0), 1606(1), 1606(2), . . . , 1606(p−1), the first step in each branch of the method is, in the case in which backward mode is in effect, to determine a value for each branch of the corresponding portion of the trellis derived from the sum of the backward state probability of the terminating state of the branch and the branch metric for the branch; if forward mode is in effect, the method determines a value for each branch of the corresponding portion of the trellis derived from the sum of the forward state probability of the originating state of the branch and the branch metric for the branch.

Next, as indicated by steps 1608(0), 1608(1), 1608(2), . . . , 1608(p−1), in the case backward mode is in effect, the method determine a backward state probability for the corresponding state by performing a group operation, e.g., MAX*, on the values determined in the previous step for all branches exiting the state while normalizing if necessary; if forward mode is in effect, the method determines a forward state probability for the corresponding state by performing a group operation, e.g., MAX*, on the values determined in the previous step for all branches entering the state, again normalizing if necessary.

The method then waits, if necessary, until all the p branches are completed. At that point, the method may branch back to step 1602 for another iteration with a new set of s a priori probabilities $\lambda$.

Figure 17:
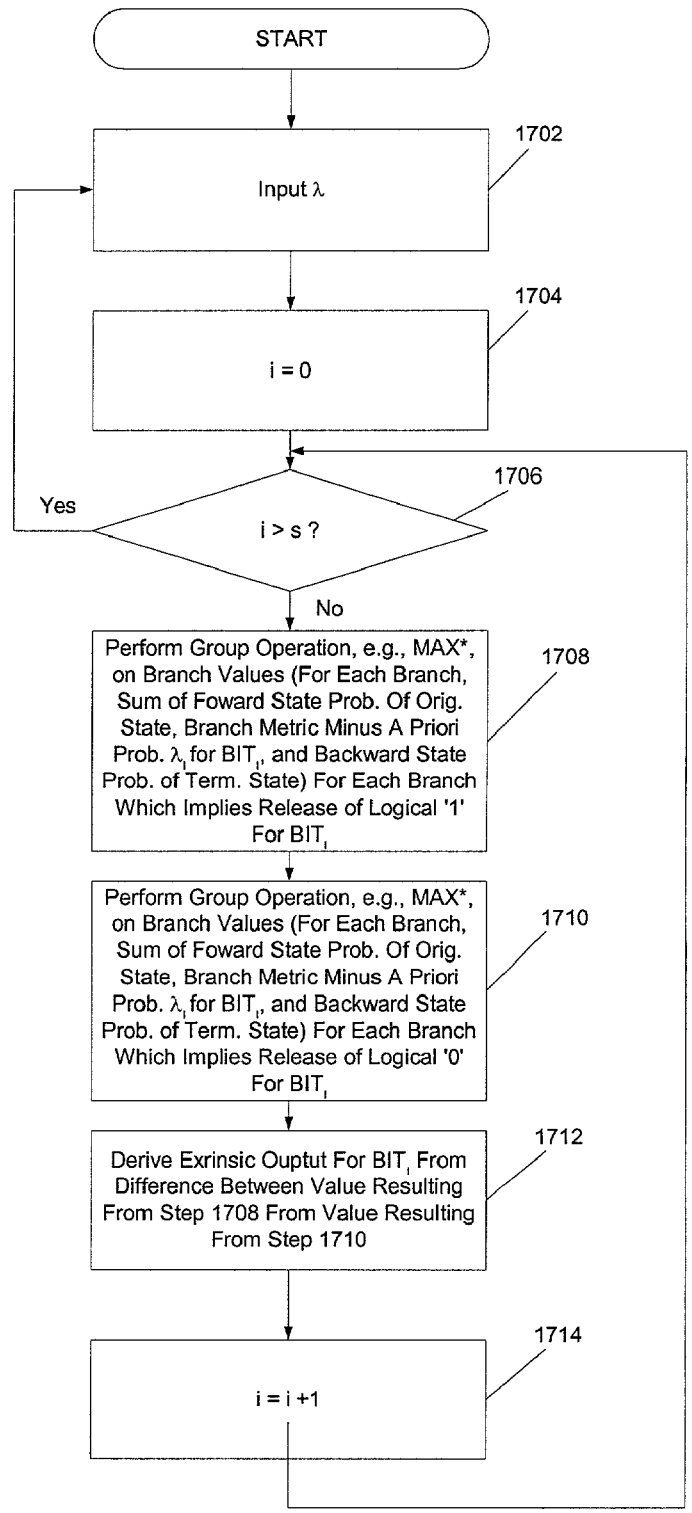
FIG. 17 is a flowchart of one embodiment of determining extrinsic outputs according to the invention.

FIG. 17 is a flowchart illustrating one embodiment of a method for determining extrinsic outputs according to the invention. As illustrated, the method begins with step 1702, in which s a priori probabilities $\lambda$ are input, one for each of the s output bits. Step 1702 is followed by step 1704, in which an index i is initialized to zero. Step 1704 is followed by step 1706, in which the index i is tested to determine if it exceeds s, the total number of output bits which correspond to a branch. If so, the method loops back to step 1702, to receive another set of s a priori probabilities $\lambda$. If not, the method proceeds to step 1708.

In step 1708, the method performs a group operation, e.g., MAX*, on the branch values for all branches which imply release of a logical '1' for $BIT_1$, the bit in question, where a branch value for a branch is derived from the sum of the forward state probability of the originating state of the branch, the branch metric for the branch, minus the a priori probability, $\lambda_i$, of the bit in question, and the backward state probability of the terminating state of the branch.

Next, in step 1710, the method performs a group operation, e.g., MAX*, on the values for all branches which imply release of a logical '0' for $BIT_i$, the bit in question, where a value for a branch is again derived from the sum of the forward state probability of the originating state of the branch, the branch metric for the branch, minus the a priori probability, $\lambda_i$, of the bit in question, and the backward state probability of the terminating state of the branch.

Step 1710 is followed by step 1712, which comprises deriving an extrinsic output for $BIT_i$ by subtracting the value derived in step 1710 from that derived in step 1708.

Step 1712 is followed by step 1714, in which the index i is incremented by 1. The method then loops back to step 1706 for another iteration. Thus, it can be seen that the method will iterate for each of the s output bits.

Figure 18:
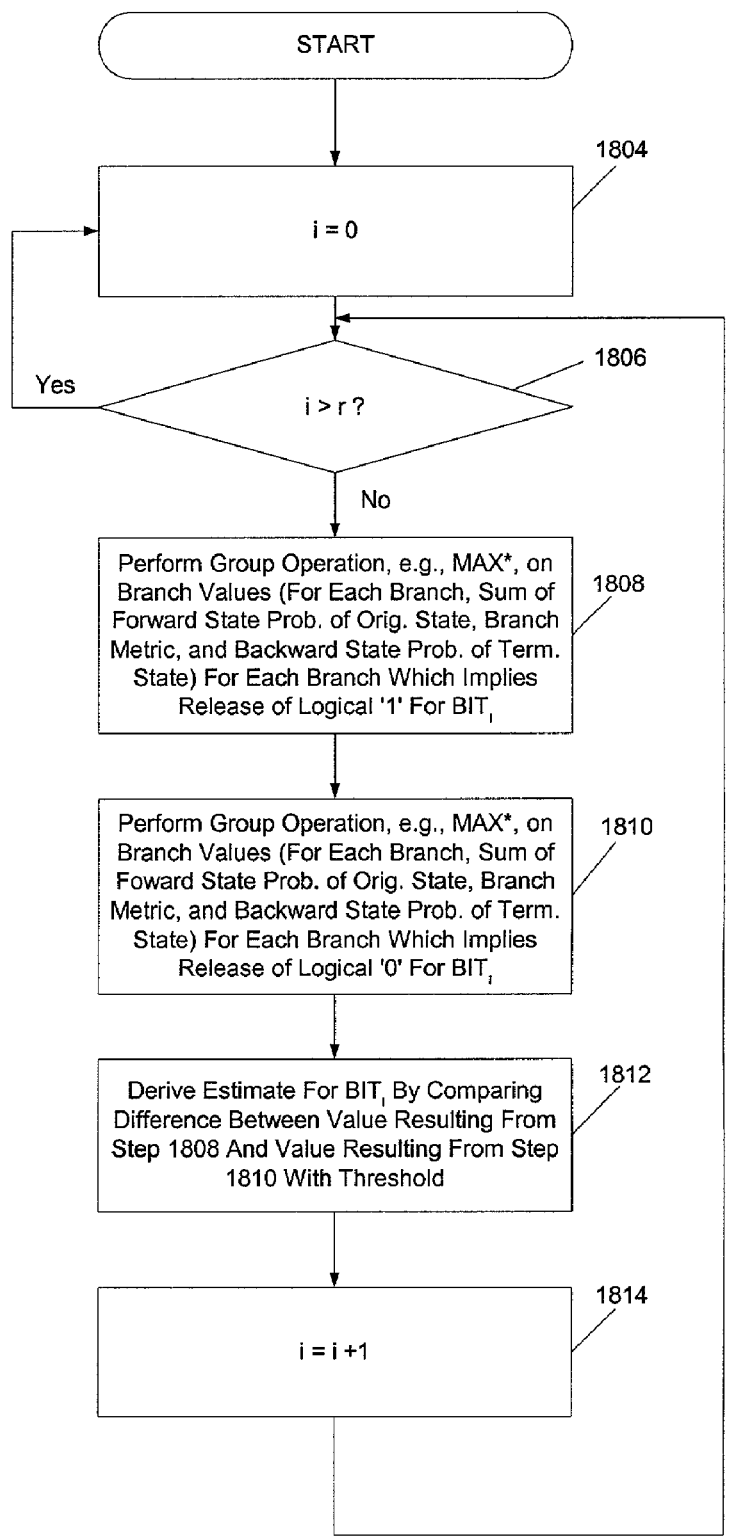
FIG. 18 is a flowchart of one embodiment of determining bit estimates according to the invention.

FIG. 18 is a flowchart illustrating one embodiment of a method for determining bit estimates according to the invention. As illustrated, the method begins with step 1804, in which an index i is initialized to zero. Step 1804 is followed by step 1806, in which the index i is tested to determine if it exceeds r, the total number of input bits which correspond to a branch. If so, the method loops back to step 1804. If not, the method proceeds to step 1808.

In step 1808, the method performs a group operation, e.g., MAX*, on branch values for all branches which imply release of a logical '1' for $BIT_i$, the bit in question, where a branch value for a branch is derived from the sum of the forward state probability of the originating state of the branch, the branch metric for the branch, and the backward state probability of the terminating state of the branch.

In one implementation, because of the associative property of the MAX* operator, and the code structure, this step is simplified to performing a group operation, e.g. MAX*, on state values for a first grouping e.g., last 16 of 32, of states in the trellis, where a state value for a state is the sum of the forward and backward state probabilities for the state.

Next, in step 1810, the method performs a group operation, e.g., MAX*, on branch values for all branches which imply release of a logical '0' for $BIT_i$, the bit in question, where a branch value for a branch is again derived from the sum of the forward state probability of the originating state of the branch, the branch metric for the branch, and the backward state probability of the terminating state of the branch.

Again, in one implementation, because of the associative property of the MAX* operator, and the code structure, this step is simplified to performing a group operation, e.g. MAX*, on state values for a second grouping e.g., first 16 of 32, of states in the trellis, where a state value for a state is the sum of the forward and backward state probabilities for the state.

Step 1810 is followed by step 1812, which comprises deriving an estimate for $BIT_1$, the bit in question, by subtracting the value derived in step 1810 from that derived in step 1808, and comparing the result with a predetermined threshold, e.g., 0. If the value equals or exceeds the threshold, the estimate is determined to be a logical '1', and if the value is less than the threshold, the estimate is determined to be a logical '0'.

Step 1812 is followed by step 1814, in which the index i is incremented by 1. The method then loops back to step 1806 for another iteration. Thus, it can be seen that the method will iterate for each of the r input bits.

Each of the foregoing methods may be tangibly embodied on a processor readable medium including without limitation RAM, ROM, PROM, EPROM, EEPROM, floppy disk, hard disk, CD-ROM, DVD, etc. Each may also be tangibly embodied as a series of executable instructions in the form of a computer program product, i.e., program code, or code module. Each may also be tangibly embodied as logic.

From the foregoing, it can be seen that there are several advantages and benefits which may be realized from the invention. One advantage which may be realized in one embodiment is a reduction in computational complexity by concurrently normalizing state probabilities while they are being computed as part of a group operation, e.g., MAX*.

A second advantage which may be realized in one embodiment is simplification of the process of determining bit estimates which is possible due to the associative property of the group operation, e.g., MAX*, and the code structure. According to this simplification, a bit estimate may be determined by performing a group operation, e.g., MAX*, on the state values for the states in a first grouping, e.g., last 16 of 32, where a state value for a state is the sum of the forward and backward state probabilities for the state, performing a group operation, e.g., MAX*, on the state values for the states in a second grouping, e.g., first 16 of 32 states, taking the difference between the two values, and comparing the resulting value with a threshold to determine the bit estimate.

A third advantage which may be realized in one embodiment is design efficiency in that a forward and backward engine may each be configured from essentially the same core module.

A fourth advantage which may be realized in one embodiment is design efficiency in that the state probability modules within the core module may each be implemented from essentially the same logic.

While various embodiments of the invention have been described, it will be apparent to those of ordinary skill in the art that many more embodiments and implementations are possible that are within the scope of this invention. For example, any combination of any of the systems or methods described in this disclosure are possible.

What is claimed is:

1. A system for determining one or more state probabilities for one or more states in a trellis representation, the system comprising:
   branch metric logic for determining one or more branch metrics for one or more branches between one or more states in a first portion of the trellis and one or more states in a second portion of the trellis; and
   state probability logic for determining one or more state probabilities for one or more of the states, comprising:
   first logic for determining for each of one or more branches a branch value, a branch connecting an originating state with a terminating state, the originating state having a forward state probability and the terminating state having a backward state probability, wherein a branch value for a branch is either the sum of the forward state probability of the originating state of the branch and the branch metric for the branch or the backward state probability of the terminating state of the branch and the branch metric for the branch; and
   second logic for deriving a state probability for a state from a group operation performed on the branch values for one or more branches.

2. The system of claim 1 wherein the group operation is MAX*.

3. The system of claim 1 wherein a forward state probability for a state is derived from the MAX* of the branch values for each of the branches entering the state, wherein the branch value for a branch is the sum of the forward state probability of the originating state of the branch and the branch metric for the branch.

4. The system of claim 1 wherein a backward state probability for a state is derived from the MAX* of the branch values for each of the branches exiting the state, wherein the branch value for a branch is the sum of the backward state probability of the terminating state of the branch and the branch metric for the branch.

5. A system for determining one or more state probabilities for one or more states in a trellis representation, the system comprising:
   branch metric logic for determining one or more branch metrics for one or more branches between one or more states in a first portion of the trellis and one or more states in a second portion of the trellis; and
   state probability logic for determining one or more state probabilities for one or more of the states, comprising:
   first logic for determining for each of one or more branches a branch value, a branch value for a branch being derived from one or more state probabilities and branch metric of the branch; and
   second logic for deriving a state probability for a state from a group operation performed on the branch values for one or more branches,
   wherein the state probability logic is configured to concurrently normalize state probabilities responsive to assertion of a normalization control signal.

6. The system of claim 5 further comprising normalization control logic for asserting the normalization control signal responsive to an evaluation of selected bits from one or more branch values.

7. The system of claim 6 wherein the normalization control logic is configured to assert the normalization control signal responsive to a comparison of the most significant bits of the one or more branch values with a predetermined threshold.

8. The system of claim 7 wherein the normalization control logic is configured to assert the normalization control signal responsive to an evaluation of the most significant bits of the branch values for each of the branches between the first and second portions of the trellis.

9. A system for determining one or more state probabilities for one or more states in a trellis representation, the system comprising:
   branch metric means for determining one or more branch metrics for one or more branches between one or more states in a first portion of the trellis and one or more states in a second portion of the trellis; and
   state probability means for determining one or more state probabilities for one or more of the states, comprising:
   first means for determining branch values for each of one or more branches, a branch connecting an originating state with a terminating state, the originating state having a forward state probability and the terminating state having a backward state probability, wherein a branch value for a branch is either the sum of the forward state probability of the originating state of the branch and the branch metric for the branch or the backward state probability of the terminating state of the branch and the branch metric for the branch; and second means for deriving a state probability for a state from a group operation performed on the branch values for one or more branches.

10. A system for determining one or more state probabilities for one or more states in a trellis representation, the system comprising:

branch metric logic for determining one or more branch metrics for one or more branches between one or more states in a first portion of the trellis and one or more states in a second portion of the trellis; and a plurality p of state probability logic modules for determining in parallel state probabilities for each of p states in either the first or second portions of the trellis, where p is an integer of two or more, each of the p modules comprising:

first logic for determining for each of one or more branches a branch value, a branch connecting an originating state with a terminating state, the originating state having a forward state probability and the terminating state having a backward state probability, wherein a branch value for a branch is either the sum of the forward state probability of the originating state of the branch and the branch metric for the branch or the backward state probability of the terminating state of the branch and the branch metric for the branch; and second logic for deriving a state probability for the state corresponding to the module from a group operation performed on the branch values for one or more branches.

11. A system for determining one or more state probabilities for one or more states in a trellis representation, the system comprising:

branch metric logic for determining one or more branch metrics for one or more branches between one or more states in a first portion of the trellis and one or more states in a second portion of the trellis; and a plurality p of state probability logic modules for determining in parallel state probabilities for each of p states in either the first or second portions of the trellis, where p is an integer of two or more, each of the p modules comprising:

first logic for determining for each of one or more branches a branch value, a branch value for a branch being derived from one or more state probabilities and a branch metric for the branch; and second logic for deriving a state probability for the state corresponding to the module from a group operation performed on the branch values for one or more branches, wherein one or more of the state probability logic modules are configured to concurrently normalize state probabilities of one or more states responsive to assertion of a normalization control signal.

12. The system of claim 11 further comprising normalization control logic configured to assert the normalization control signal responsive to an evaluation of selected bits from the branch values of one or more branches.

13. The system of claim 12 wherein the normalization control logic is configured to assert the normalization control signal responsive to a comparison of the most significant bits of the branch values for each of one or more branches between the first and second portions of the trellis with a predetermined threshold.

14. A system for determining estimates of or extrinsic outputs for one or more bits using a trellis representation, the trellis representation comprising one or more branches between one or more states, with one or more of the states having forward and backward state probabilities, with one or more of the branches having branch metrics, and with all the branches terminating at a state implying release of the same value so that the state also implies release of the value, the system comprising:

first logic for deriving a state value for each of one or more states, a state value for a state being derived from the forward state probability of the state and the backward state probability of the state;

second logic for deriving a first value by performing a group operation on the state values for the one or more of the states which imply release of a logical '1' for a bit;

third logic for deriving a second value by performing a group operation on the state values for the one or more of the states which imply release of a logical '0' for the bit; and fourth logic for deriving an estimate of or extrinsic output for the bit from the first and second values.

15. The system of claim 14 wherein the fourth logic derives an estimate of the bit by comparing the first and second values for the bit with a predetermined threshold.

16. The system of claim 14 wherein the group operation is the MAX* operation.

17. The system of claim 14 which is configured to iterate r times, wherein r is an integer of one or more, for each of r bits.

18. The system of claim 14 wherein the states which imply release of a logical '1' for the bit are a predetermined first grouping of states, and the states which imply release of a logical '0' for the bit are a predetermined second grouping of states.

19. A system for determining an estimate of or extrinsic output for one or more bits using a trellis representation, the trellis representation comprising one or more branches between one or more states, with one or more of the states having forward and backward state probabilities, with one or more of the branches having branch metrics, and with all the branches terminating at a state implying release of the same value so that the state also implies release of the value, the system comprising:

first means for deriving a state value for each of one or more states, a state value for a state being derived from the forward state probability of the state and the backward state probability of the state;

second means for deriving a first value by performing a group operation on the state values for one or more of the states which imply release of a logical '1' for a bit;

third means for deriving a second value by performing a group operation on the state values for one or more of the states which imply release of a logical '0' for the bit; and fourth means for deriving an estimate of the bit from the first and second values.

20. The system of claim 19 wherein the fourth means derives an estimate of a bit by comparing the difference between the first and second values with a predetermined threshold.

21. A system for determining an estimate of or extrinsic output for one or more bits using a trellis representation, the trellis representation comprising one or more branches between one or more branches between one or more states, with one or more states having forward and backward state probabilities, and one or more branches having branch metrics, with all the branches connecting a particular originating and terminating state implying release of the same value, the system comprising:

first logic for determining branch values for each of one or more branches, a branch value for a branch being derived from one or more state probabilities, and the branch metric for the branch;

second logic for determining a first value by performing a group operation on the branch values for the branches which imply release of a logical "1" for the bit;

third logic for determining a second value by performing a group operation on the branch values for the branches which imply release of a logical "0" for the bit; and fourth logic for deriving an estimate or extrinsic output for the bit from the first and second values.

22. The system of claim 21 wherein the first logic is configured to determine a branch value for a branch from an a priori probability for the bit.

23. The system of claim 22 wherein the first logic is configured to determine a branch value for a branch from the sum of the forward state probability of the originating state of the branch, the backward state probability of the terminating state of the branch, and the difference between the branch metric for the branch and the a priori probability for the bit.

24. The system of claim 21 configured to iterate s times, where s is an integer of one or more, for each of s bits.

25. The system of claim 21 wherein the fourth logic is configured to determine an extrinsic output for the bit from the difference between the first and second values.

26. A system for determining an estimate of or extrinsic output for one or more bits using a trellis representation, the trellis representation comprising one or more branches between one or more branches between one or more states, with one or more states having forward and backward state probabilities, and one or more branches having branch metrics, with all the branches connecting a particular originating and terminating state implying release of the same value, the system comprising:

first means for determining branch values for each of one or more branches, a branch value for a branch being derived from one or more state probabilities, and the branch metric for the branch;

second means for determining a first value by performing a group operation on the branch values for the branches which imply release of a logical "1" for the bit;

third means for determining a second value by performing a group operation on the branch values for the branches which imply release of a logical "0" for the bit; and fourth means for deriving an estimate or extrinsic output for the bit from the first and second values.

27. A system for computing the MAX* of operands A and B comprising:

first logic for testing the difference A−B relative to zero, and outputting a signal indicative thereof;

second logic for determining the maximum of the operands A and B, MAX(A,B), by outputting a signal representative of the operand A if the signal from the first logic indicates that the difference A−B is greater than zero, and outputting a signal representative of the operand B otherwise;

third logic for outputting a value corresponding to $\ln(1+\exp(-|A-B|))$; and fourth logic for adding the outputs of the second and third logic, subtracting a predetermined normalization value responsive to assertion of a normalization control signal, and outputting a signal indicative thereof.

28. A system for computing the MAX* of operands A and B comprising:

first means for testing the difference A−B relative to zero, and outputting a signal indicative thereof;

second means for determining the maximum of the operands A and B, MAX(A,B), by outputting a signal representative of the operand A if the signal from the first logic indicates that the difference A−B is greater than zero, and outputting a signal representative of the operand B otherwise;

third means for outputting a value corresponding to $\ln(1+\exp(-|A-B|))$; and fourth means for adding the outputs of the second and third logic, subtracting a predetermined normalization value responsive to assertion of a normalization control signal, and outputting a signal indicative thereof.

29. A system for computing one or more state probabilities in a trellis representation comprising one or more branches between one or more states in a first portion of the trellis representation and one or more branches in a second portion of the trellis representation, the system comprising:

branch metric logic for computing one or more branch metrics for one or more of the branches;

indication logic for indicating whether the system is configured to compute forward state probabilities or backward state probabilities;

state probability logic for (1) computing one or more forward state probabilities for one or more states in the second portion of the trellis, while concurrently normalizing the forward state probabilities responsive to assertion of a normalization control signal; or (2) computing one or more backward state probabilities of one or more states in the first portion of the trellis, while concurrently normalizing the backward state probabilities responsive to assertion of a normalization control signal.

30. The system of claim 29 further comprising estimation logic for computing estimates of each of r bits, where r is an integer of one or more.

31. The system of claim 30 wherein the estimation logic is activated only when the system is configured to compute forward state probabilities.

32. The system of claim 29 further comprising extrinsic output logic for computing an extrinsic output for each of s bits, where s is an integer of one or more.

33. The system of claim 32 wherein the extrinsic output logic is activated only when the system is configured to compute forward state probabilities.

34. A system for computing one or more state probabilities in a trellis representation comprising one or more branches between one or more states in a first portion of the trellis representation and one or more branches in a second portion of the trellis representation, the system comprising:

branch metric means for computing one or more branch metrics for one or more of the branches;

indication means for indicating whether the system is configured to compute forward state probabilities or backward state probabilities;

state probability means for (1) computing one or more forward state probabilities for one or more states in the second portion of the trellis, while concurrently normalizing the forward state probabilities responsive to assertion of a normalization control signal; or (2) computing one or more backward state probabilities for one or more states in the first portion of the trellis, while concurrently normalizing the backward state probabilities responsive to assertion of a normalization control signal.

35. The system of claim 34 further comprising estimation means for computing an estimate of each of r bits, wherein r is an integer of one or more.

36. The system of claim 34 further comprising extrinsic output means for computing an extrinsic output for each of s bits, where s is an integer of one or more.

37. In decoding logic, a method of determining one or more state probabilities for one or more states in a trellis representation, the method comprising:
   determining one or more branch metrics for one or more branches between one or more states in a first portion of the trellis and one or more states in a second portion of the trellis;
   determining for each of one or more branches a branch value, a branch connecting an originating state with a terminating state, the originating state having a forward state probability and the terminating state having a backward state probability, wherein a branch value for a branch is either the sum of the forward state probability of the originating state of the branch and the branch metric for the branch or the backward state probability of the terminating state of the branch and the branch metric for the branch; and
   deriving a state probability for a state from a group operation performed on the branch values for one or more branches.

38. The method of claim 37 wherein the group operation is MAX*.

39. The method of claim 37 wherein a forward state probability for a state is derived from the MAX* of the branch values for each of the branches entering the state, wherein a branch value for a branch is the sum of the forward state probability of the originating state of the branch and the branch metric for the branch.

40. The method of claim 37 wherein a backward state probability for a state is derived from the MAX* of the branch values for each of the branches exiting the state, wherein a branch value for a branch is the sum of the backward state probability of the terminating state of the branch and the branch metric for the branch.

41. In decoding logic, a method of determining one or more state probabilities for one or more states in a trellis representation, the method comprising:
   determining one or more branch metrics for one or more branches between one or more states in a first portion of the trellis and one or more states in a second portion of the trellis;
   determining for each of one or more branches a branch value derived from one or more state probabilities, and the branch metric for the branch;
   deriving a state probability for a state from a group operation performed on the branch values for one or more branches; and
   normalizing the one or more state probabilities responsive to assertion of a normalization control signal.

42. The method of claim 41 further comprising asserting the normalization control signal responsive to an examination of selected bits from the branch values of one or more of the branches.

43. The method of claim 42 further comprising asserting the normalization control signal responsive to a comparison of the most significant bits of the branch values with a predetermined threshold.

44. The method of claim 42 further comprising asserting the normalization control signal responsive to an evaluation of the most significant bits of the branch values for each of the branches between the first and second portions of the trellis.

45. In decoding logic, a method of determining one or more state probabilities for one or more states in a trellis representation, the method comprising:
   a step for determining one or more branch metrics for one or more branches between one or more states in a first portion of the trellis and one or more states in a second portion of the trellis;
   a step for deriving a branch value for each of one or more branches, a branch connecting an originating state with a terminating state, the originating state having a forward state probability and the terminating state having a backward state probability, wherein a branch value for a branch is either the sum of the forward state probability of the originating state of the branch and the branch metric for the branch or the backward state probability of the terminating state of the branch and the branch metric for the branch; and
   a step for deriving a state probability for each of one or more states, the state probability for a state being derived from a group operation performed on the branch values of one or more branches.

46. In decoding logic, a method of determining one or more state probabilities for states in a trellis representation, the method comprising:
   determining one or more branch metrics for one or more branches between one or more states in a first portion of the trellis and one or more states in a second portion of the trellis; and
   determining in parallel state probabilities for each of p states, where p is an integer of two or more, by performing the following substeps in parallel for each of the p states:
      determining for each of one or more branches a branch value a branch connecting an originating state with a terminating state, the originating state having a forward state probability and the terminating state having a backward state probability, wherein a branch value for a branch is either the sum of the forward state probability of the originating state of the branch and the branch metric for the branch or the backward state probability of the terminating state of the branch and the branch metric for the branch; and
      deriving a state probability for the state from a group operation performed on the branch values for one or more branches.

47. In decoding logic, a method of determining one or more state probabilities for one or more states in a trellis representation, the method comprising:
   a step for determining one or more branch metrics for one or more branches between one or more states in a first portion of the trellis and one or more states in a second portion of the trellis:
   a step for deriving a branch value for each of one or more branches, the branch value for a branch being derived from one or more state probabilities and a branch metric for the branch;
   a step for deriving a state probability for each of one or more states, the state probability for a state being derived from a group operation performed on the branch values of one or more branches; and normalizing the state probabilities for each of the p states responsive to assertion of a normalization control signal.

48. The method of claim 47 further comprising asserting the normalization control signal responsive to an examination of selected bits for one or more of branch values.

49. The method of claim 48 further comprising asserting the normalization control signal responsive to examination of the most significant bits of the one or more branch values.

50. The method of claim 49 further comprising asserting the normalization control signal responsive to a comparison of the most significant bits of the branch values for each of the branches between the first and second portions of the trellis with a predetermined threshold.

51. In decoding logic, a method of determining an estimate or extrinsic output of one or more bits from a trellis representation, the trellis representation comprising one or more branches between one or more states, with one or more of the states having forward and backward state probabilities, and with one or more of the branches having branch metrics, with all the branches connecting a particular originating and terminating state implying release of the same value, the method comprising:
   deriving a state value for each of one or more states, the state value for a state being derived from the forward state probability of the state and the backward state probability of the state;
   deriving a first value by performing a group operation on the state values for one or more of the states which imply release of a logical '1' for a bit;
   deriving a second value by performing a group operation on the state values for one or more of the states which imply release of a logical '0' for the bit; and
   deriving an estimate of or extrinsic output for the bit from the first and second values.

52. The method of claim 51 further comprising deriving an estimate of a bit by comparing the first and second values with a predetermined threshold.

53. The method of claim 51 wherein the group operation is the MAX* operation.

54. The method of claim 51 further comprising performing r iterations of the method, wherein r is an integer of one or more, for each of r bits.

55. The method of claim 51 further comprising deriving the first value from a group operation performed on a predetermined first grouping of one or more states, and deriving the second value from a group operation performed on a predetermined second grouping of one or more states.

56. In decoding logic, a method of determining an estimate of or extrinsic output for one or more bits from a trellis representation, the trellis representation comprising one or more branches between one or more states, with one or more of the states having forward and backward state probabilities, and with one or more of the branches having branch metrics, with all the branches connecting a particular originating and terminating state implying release of the same value, the method comprising:
   a step for deriving a state value for each of one or more states, the state value for a state being derived from the forward state probability of the state and the backward state probability of the state;
   a step for deriving a first value by performing a group operation on the state values for one or more states which imply release of a logical '1' for a bit;
   a step for deriving a second value by performing a group operation on the state values for one or more states which imply release of a logical '0' for the bit; and
   a step for deriving an estimate of or extrinsic output for the bit from the first and second values.

57. In decoding logic, a method of determining an estimate of or extrinsic output for one or more bits using a trellis representation, the trellis representation comprising one or more branches between one or more branches between one or more states, with one or more states having forward and backward state probabilities, and one or more branches having branch metrics, with all the branches connecting a particular originating and terminating state implying release of the same value, the method comprising:
   determining branch values for each of one or more branches, a branch value for a branch being derived from one or more state probabilities, and the branch metric for the branch;
   determining a first value by performing a group operation on the branch values for the branches which imply release of a logical "1" for the bit;
   determining a second value by performing a group operation on the branch values for the branches which imply release of a logical "0" for the bit; and
   deriving an estimate or extrinsic output for the bit from the first and second values.

58. The method of claim 57 further comprising determining a branch value for a branch from an a priori probability for the bit.

59. The method of claim 57 further comprising performing s iterations of the method, where s is an integer of one or more, for each of s bits.

60. The method of claim 57 further comprising determining a branch value for a branch from the sum of the forward state probability of the originating state of the branch, the backward state probability of the terminating state of the branch, and the difference between the branch metric for the branch and the a priori probability for the bit.

61. The method of claim 57 further comprising determining an extrinsic output for the bit from the difference between the first and second values.

62. In decoding logic, a method of determining an estimate of or extrinsic output for one or more bits using a trellis representation, the trellis representation comprising one or more branches between one or more branches between one or more states, with one or more states having forward and backward state probabilities, and one or more branches having branch metrics, with all the branches connecting a particular originating and terminating state implying release of the same value, the method comprising:
   a step for determining branch values for each of one or more branches, a branch value for a branch being derived from one or more state probabilities, and the branch metric for the branch;
   a step for determining a first value by performing a group operation on the branch values for the branches which imply release of a logical "1" for the bit;
   a step for determining a second value by performing a group operation on the branch values for the branches which imply release of a logical "0" for the bit; and
   a step for deriving an estimate or extrinsic output for the bit from the first and second values.

63. In decoding logic, a method of computing the MAX* of operands A and B comprising:
   testing the difference A−B relative to zero, and outputting a signal indicative thereof;
   determining the maximum of the operands A and B, MAX(A,B), by outputting a signal representative of the operand A if the signal resulting from the testing step indicates that the difference A–B is greater than zero, and outputting a signal representative of the operand B otherwise;

outputting a value corresponding to ln(1+exp(–|A–B|));

adding the outputs of the second and third steps;

normalizing the sum responsive to assertion of a normalization control signal; and outputting a signal representative of the normalized sum.

64. In decoding logic, a method of computing state probabilities for each of one or more states in a trellis representation comprising one or more branches between one or more states, the method comprising:

computing branch metrics for each of one or more branches;

indicating whether forward or backward operation is desired;

if forward operation is desired, computing forward state probabilities for each of one or more states, responsive to one or more state probabilities and one or more branch metrics; and if backward operation is desired, computing one or more backward state probabilities of one or more states, responsive to one or more state probabilities and one or more branches metrics.

65. The method of claim 64 further comprising determining estimates of each of r bits, where r is an integer of one or more.

66. The method of claim 65 further comprising determining estimates of the r bits only when forward operation is indicated.

67. The method of claim 64 further comprising determining extrinsic outputs for each of s bits, where s is an integer of one or more.

68. The method of claim 67 further comprising determining extrinsic outputs for the s bits only when forward operation is desired.

69. The method of claim 64 further comprising normalizing one or more state probabilities responsive to assertion of a normalization control signal.

70. In decoding logic, a method of computing one or more state probabilities in a trellis representation comprising one or more branches between one or more states, the method comprising:

a step for computing one or more branch metrics for one or more of the branches;

a step for indicating whether forward or backward operation is desired;

a step for computing, if forward operation is desired, one or more forward state probabilities of one or more states; and a step for computing, if backward operation is desired, one or more backward state probabilities of one or more states.

71. The method of claim 70 further comprising a step for determining estimates of each of r bits, where r is an integer of one or more.

72. The method of claim 71 further comprising a step for determining estimates of the r bits only when forward operation is desired.

73. The method of claim 70 further comprising a step for determining extrinsic outputs for each of s bits, where s is an integer of one or more.

74. The method of claim 73 further comprising a step for determining extrinsic outputs for the s bits only when forward operation is desired.

75. The methods of any of claims 37, 45, 46, 51, 56, 57, 62, 63, 64, and 70, tangibly embodied as a series of instructions stored on a processor readable medium.

76. A system comprising a processor and the medium of claim 75.

77. The methods of any of claims 37, 45, 46, 51, 56, 57, 62, 63, 64, and 70, tangibly embodied as logic.

78. The method of claim 70 further comprising normalizing one or more state probabilities responsive to assertion of a normalization control signal.

79. In decoding logic, a method of determining one or more state probabilities for one or more states in a trellis representation, the method comprising:

a step for determining one or more branch metrics for one or more branches between one or more states in a first portion of the trellis and one or more states in a second portion of the trellis;

a step for deriving a branch value for each of one or more branches, the branch value for a branch being derived from one or more state probabilities and a branch metric for the branch;

a step for deriving a state probability for each of one or more states, the state probability for a state being derived from a group operation performed on the branch values of one or more branches; and a step for normalizing one or more state probabilities responsive to assertion of a normalization control signal.

* * * * *